(12) United States Patent
Tamaki

(10) Patent No.: US 7,239,164 B2
(45) Date of Patent: Jul. 3, 2007

(54) STACK TYPE SEMICONDUCTOR APPARATUS PACKAGE AND MANUFACTURING METHOD THEREOF

(75) Inventor: Kazuo Tamaki, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 151 days.

(21) Appl. No.: 11/193,465

(22) Filed: Aug. 1, 2005

(65) Prior Publication Data

US 2006/0027841 A1 Feb. 9, 2006

(30) Foreign Application Priority Data

Aug. 4, 2004 (JP) .............................. 2004-228402

(51) Int. Cl.
*G01R 31/28* (2006.01)
*H01L 23/02* (2006.01)

(52) U.S. Cl. ....................................... 324/763; 257/686

(58) Field of Classification Search ................ 324/763, 324/765, 158.1; 257/686, E25.021, E25.027, 257/723, 778; 438/108–109, 455; 29/840
See application file for complete search history.

(56) References Cited

U.S. PATENT DOCUMENTS

| 6,157,080 | A | 12/2000 | Tamaki et al. | |
| 6,642,610 | B2 * | 11/2003 | Park et al. | 257/678 |
| 6,930,378 | B1 * | 8/2005 | St. Amand et al. | 257/686 |
| 7,087,989 | B2 * | 8/2006 | Nakayama | 257/686 |

FOREIGN PATENT DOCUMENTS

| JP | 11-219984 | 8/1999 |
| JP | 2003-234451 | 8/2003 |

* cited by examiner

*Primary Examiner*—Ha Tran Nguyen
*Assistant Examiner*—Tung X. Nguyen
(74) *Attorney, Agent, or Firm*—Nixon & Vanderhye, P.C.

(57) ABSTRACT

A stack type semiconductor apparatus package includes: (i) a first circuit substrate, (ii) a semiconductor apparatus package mounted on the first circuit substrate, (iii) a semiconductor apparatus, and (iv) a sealing resin for covering them. The first circuit substrate has a surface on which first connecting pads and second connecting pads are provided. The first connecting pads are connected to first external input/output terminals of the semiconductor apparatus package, and the second connecting pads are connected to electrodes of the first semiconductor apparatus, respectively. On a rear surface of the first circuit substrate, there are provided second external input/output terminals connected to the first connecting pads and the second connecting pads. The semiconductor apparatus package includes: a second circuit substrate, and a second semiconductor apparatus mounted on the second circuit substrate. On a surface of the second circuit substrate, there are provided third connecting pads connected to electrodes of the second semiconductor apparatus, respectively. The first external input/output terminals are provided on a rear surface of the second circuit substrate. This makes it possible to provide a stack type semiconductor apparatus package that can be easily manufactured with inexpensive cost.

26 Claims, 30 Drawing Sheets

STACK TYPE SEMICONDUCTOR APPARATUS PACKAGE AND MANUFACTURING METHOD THEREOF

This Nonprovisional application claims priority under 35 U.S.C. § 119(a) on Patent Application No. 2004/228402 filed in Japan on Aug. 4, 2004, the entire contents of which are hereby incorporated by reference.

FIELD OF THE INVENTION

The present invention relates to (i) a stack type semiconductor apparatus package which is used as a CSP (Chip Size Package), a BGA (Ball Grid Array), or the like and which is obtained by stacking a plurality of semiconductor apparatuses; and (ii) a manufacturing method thereof.

BACKGROUND OF THE INVENTION

Conventionally used is a semiconductor apparatus package containing a semiconductor apparatus (semiconductor chip).

Downsizing and weight saving of a mobile information device requires high density packaging of semiconductor apparatuses. Proposed in recent years in response to such a demand is a stack type semiconductor apparatus package (stack type multi-chip package) obtained by stacking a plurality of semiconductor apparatuses (semiconductor chips) in a single package. See patent documents 1 and 2.

The following fully explains a conventional stack type semiconductor apparatus package described in the patent document 1. FIG. 34 is a cross sectional view illustrating a structure of the conventional stack type semiconductor apparatus package described in the patent document 1.

As shown in FIG. 34, the conventional semiconductor apparatus package is arranged as follows. That is, electrodes of a first semiconductor apparatus 201 are electrically connected, via connecting metal members 205, to first connecting pads 206 formed in a first face of a circuit substrate 219, respectively. The electric connecting is carried out in accordance with the flip method. There is provided an interface sealing resin 209 in a void between (i) an element face of the first semiconductor apparatus 201 and (ii) the first face of the circuit substrate 219. Further, a second semiconductor apparatus 202 is provided on a rear face of the first semiconductor apparatus 201 such that a rear face of the second semiconductor apparatus 201 faces and is aligned with the rear face of the first semiconductor apparatus 201. The second semiconductor apparatus 202 has electrodes 204 which are electrically connected, via thin metal wires 208, to second connecting pads 207 provided outside the first connecting pads 206 provided on the circuit substrate 219, respectively. Each first connecting pad 206 and each second connecting pad 207, both of which are provided on the first face of the circuit substrate 219, are electrically connected to each other via external input/output terminals 230 and 226 provided on a second face of the circuit substrate 219.

[Patent Document 1]
U.S. Pat. No. 6,157,080 (corresponding to Japanese Unexamined Patent Publication Tokukaihei 11-219984/1999 (published on Aug. 10, 1999)

[Patent Document 2]
Japanese Unexamined Patent Publication Tokukai 2003-234451 (published on Aug. 22, 2003)

Generally, electrode positions (positions of electrodes) are different among various types of semiconductor apparatus, so that the following inconvenience occurs when manufacturing a plurality of such stack type semiconductor apparatus packages having different types of first semiconductor apparatus. That is, such a difference in the electrode positions makes it impossible that a circuit substrate prepared for a stack type semiconductor apparatus package is used for manufacture of another stack type semiconductor apparatus package having a different type of first semiconductor apparatus (semiconductor apparatus mounted on the circuit substrate in accordance with the flip chip mounting technology), so that another circuit substrate needs to be prepared so as to accommodate to the electrode positions of the semiconductor apparatus having the different type of first semiconductor apparatus. In other words, a plurality of types of first circuit substrate need to be prepared for the manufacture of a plurality of stack type semiconductor apparatus packages having different types of first semiconductor apparatus. This requires relatively much work and cost.

Each of such stack type semiconductor apparatus packages having different types of first semiconductor apparatus is manufactured in cases where, e.g., the first semiconductor apparatus serves as a memory semiconductor apparatus and the second semiconductor apparatus serves as a logic semiconductor apparatus, and where a plurality of types of memory semiconductor apparatus are used for the first semiconductor apparatus. This is because designs (chip size, the number of pads, pad position, etc.) of the semiconductor apparatuses generally differ among semiconductor apparatus manufacturers.

Moreover, each of such stack type semiconductor apparatus packages having different types of first semiconductor apparatus is manufactured also in the following case. That is, the stack type semiconductor apparatus package is manufactured such that the first semiconductor apparatus serves as a memory semiconductor apparatus and the second semiconductor apparatus serves as a logic semiconductor apparatus, and where the memory semiconductor apparatus is replaced, after the manufacturing, with a memory semiconductor apparatus having a larger memory capacity.

Further, the following case is also presumable. That is, the stack type semiconductor package is manufactured such that the first semiconductor apparatus serves as a memory semiconductor apparatus and the second semiconductor apparatus serves as a logic semiconductor apparatus; however, for increase of the memory capacity of the memory semiconductor apparatus, the first semiconductor apparatus and the second semiconductor apparatus are replaced with each other after the manufacturing such that the first semiconductor apparatus serves as the logic semiconductor apparatus and the second semiconductor apparatus serves as the memory semiconductor apparatus. However, only wire bonding cannot deal with such a case where the number of the pads and the positions of the pads are different between the memory semiconductor apparatuses. Accordingly, another circuit substrate needs to be manufactured.

Further, the first semiconductor apparatus of the conventional stack type semiconductor apparatus package shown in FIG. 34 is possibly not a KGD (Known Good Die; a semiconductor whose quality is guaranteed). In the case where the first semiconductor apparatus is not a KGD, a defect of the first semiconductor apparatus possibly causes the stack type semiconductor apparatus package to be entirely defective. With this, a repair process is possibly required.

SUMMARY OF THE INVENTION

The present invention is made to provide a stack type semiconductor apparatus package which uses a plurality of types of semiconductor apparatus, and which can be easily manufactured with inexpensive cost.

To achieve the object, a stack type semiconductor apparatus package of the present invention includes: (1) at least one semiconductor apparatus package, which has a plurality of first input/output terminals; 2) a first circuit substrate, on which the semiconductor apparatus package is mounted, the first circuit substrate having a first face and a second face; (3) at least one first semiconductor apparatus, which is stacked on the semiconductor apparatus package and which has a plurality of first electrodes; (4) a plurality of first connecting pads, which are so provided on the first face of the first circuit substrate as to respectively correspond to the first external input/output terminals of the semiconductor apparatus package, and which are electrically connected to the first external input/output terminals of the semiconductor apparatus package respectively; (5) a plurality of second connecting pads, which are so provided on the first face of the first circuit substrate as to be provided on an outer side of the first connecting pads, and which are electrically connected to the first electrodes of the first semiconductor apparatus respectively; (6) a plurality of second external input/output terminals, which are provided on the second face of the first circuit substrate, and which are made up of (i) external input/output terminals electrically connected to the first connecting pads in a predetermined manner, and (ii) external input/output terminals electrically connected to the second connecting pads in a predetermined manner; and (7) a first resin for covering the first semiconductor apparatus and the semiconductor apparatus package, the semiconductor apparatus package including: (1) a second semiconductor apparatus, which has a plurality of second electrodes; (2) a second circuit substrate, on which the second semiconductor apparatus is mounted, the second circuit substrate having a third face and a fourth face; (3) a plurality of third connecting pads, which are provided on the third face of the second circuit substrate, and which are electrically connected to the second electrodes of the second semiconductor apparatus respectively; and (4) a second resin for covering the second semiconductor apparatus, the first external input/output terminals being provided on the fourth face of the second circuit substrate, and being electrically connected to the third connecting pads, respectively.

Unlike the conventional stack type semiconductor apparatus package, the structure provides the following beneficial effect in the case of manufacturing a plurality of types of stack type semiconductor apparatus package including second semiconductor apparatuses having different structures (e.g., the positions of the second electrodes).

That is, another first circuit substrate does not need to be prepared. Specifically, a first circuit substrate prepared for manufacture of a stack type semiconductor apparatus package including a semiconductor apparatus package is also used for manufacture of another stack type semiconductor apparatus including a different type of second semiconductor apparatus. Such a beneficial effect is obtained by preparing a semiconductor apparatus package (i) whose terminal positions (positions of the first external input/output terminals) are identical to the terminal positions of the semiconductor apparatus package used for the manufacture of the foregoing stack type semiconductor apparatus, and (ii) which includes a second semiconductor apparatus whose type is different from that of the foregoing semiconductor apparatus package. For the preparation of such a semiconductor apparatus package having the identical terminal positions and the different type of second semiconductor apparatus, another second circuit substrate possibly needs to be prepared so as to accommodate to the different type of second semiconductor apparatus. However, the second circuit substrate has a simpler structure than the first circuit substrate does, so that the work and the cost each required for the preparation of the second circuit substrate are less as compared with the work and the cost each required for the preparation of another first circuit substrate. Therefore, only relatively little work and small cost are required for the manufacture of the stack type semiconductor apparatus packages including different types of second semiconductor apparatuses (e.g., semiconductor apparatuses supplied from different semiconductor apparatus manufacturers; and memory semiconductor apparatuses having different memory capacities).

Even when the first circuit substrate is not modified as such, a plurality of types of complex memory package can be manufacture by assembling, as the semiconductor apparatus package, each of a plurality of types of packaged memory, in which respective positions of external input/output terminals are identical (common). This is especially effective. Such packaged memories are purchased from a plurality of semiconductor apparatus manufacturers.

In the structure, the semiconductor apparatus package is subjected to a test after packaging, irrespective of whether or not the semiconductor apparatus package is a general one. With this, the second semiconductor apparatus provided in the semiconductor apparatus package is substantially guaranteed as the KGD. Therefore, such a second semiconductor apparatus having no defect never causes the stack type semiconductor apparatus package to be entirely defective. In other words, the stack type semiconductor apparatus package never becomes defective as long as the first semiconductor apparatus is a good one. As such, the manufactured stack type semiconductor apparatus package never becomes defective when the first semiconductor apparatus is a good one, so that such a good first semiconductor apparatus is never wasted. Especially, in cases where the second semiconductor apparatus is a memory type semiconductor apparatus (memory element) in a package and the first semiconductor apparatus is a logic type semiconductor apparatus (logic element), the packaging of the second semiconductor apparatus allows the memory type semiconductor apparatus in the package to be substantially guaranteed as the KGD. So, such a memory type semiconductor apparatus having no defect never causes the manufactured stack type semiconductor apparatus package (SiP (system in Package)) to be entirely defective, when the logic type semiconductor apparatus is a good one. Accordingly, such a good and expensive logic type semiconductor is never wasted. As such, the present invention is especially effective in cases where the first semiconductor apparatus is relatively expensive one such as a logical element, and where the second semiconductor apparatus is relatively inexpensive one such as a memory element.

To achieve the object, a method for manufacturing a stack type semiconductor apparatus package of the present invention, the package including: (1) at least one semiconductor apparatus package, which has a plurality of first input/output terminals; (2) a first circuit substrate, on which the semiconductor apparatus package is mounted, the first circuit substrate having a first face and a second face; (3) at least one first semiconductor apparatus, which is stacked on the semiconductor apparatus package and which has a plurality of first electrodes; (4) a plurality of first connecting pads, which are so provided on the first face of the first circuit substrate as to respectively correspond to the first external input/output terminals of the semiconductor apparatus package; (5) a plurality of second connecting pads, which are so provided on the first face of the first circuit substrate as to be provided on an outer side of the first connecting pads; and (6) a plurality of second external input/output terminals, which are provided on the second face of the first circuit substrate, and which are made up of (i) external input/output terminals electrically connected to the first connecting pads in a predetermined manner, and (ii) external input/output terminals electrically connected to the second connecting pads in a predetermined manner; and the semiconductor apparatus package including: (1) a second semiconductor apparatus, which has a plurality of second electrodes; (2) a second circuit substrate, on which the second semiconductor apparatus is mounted, the second circuit substrate having a third face and a fourth face; (3) a plurality of third connecting pads, which are provided on the third face of the second circuit substrate, and which are electrically connected to the second electrodes of the second semiconductor apparatus respectively; and (4) a second resin for covering the second semiconductor apparatus, the first external input/output terminals being provided on the fourth face of the second circuit substrate, and being electrically connected to the third connecting pads respectively, the method including the steps of: (A) connecting the first external input/output terminals of the semiconductor apparatus package to the first connecting pads provided on the first circuit substrate, by using at least one of heat, load, and a supersonic wave; (B) electrically connecting the first electrodes of the first semiconductor apparatus to the second connecting pads of the first circuit substrate via a thin metal wire in accordance with a wire bonding method; and (C) covering the first semiconductor apparatus and the semiconductor apparatus package with a first resin.

According to the method, it is possible to manufacture the stack type semiconductor apparatus according to the present invention, i.e., the stack type semiconductor apparatus in which each of the first external input/output terminals of the semiconductor and each of the first connecting pads are electrically connected with each other, and in which each of the first electrodes of the first semiconductor apparatus and each of the second connecting pads are electrically connected with each other via each of the thin metal wires in accordance with the wire bonding method.

As described above, the present invention makes it possible that: a first circuit substrate prepared for manufacture of a stack type semiconductor apparatus package, obtained by stacking a semiconductor apparatus package and a semiconductor apparatus on the first circuit substrate, is used for manufacture of another stack type semiconductor apparatus package including a different type of second semiconductor apparatus. With this, another first circuit substrate does not need to be manufactured. As such, with relatively little work and small cost, the present invention makes it possible to provide (i) the stack type semiconductor apparatus packages including different types of second semiconductor apparatuses (e.g., semiconductor apparatuses supplied from different semiconductor apparatus manufacturers; and memory semiconductor apparatuses having different memory capacities), and (ii) the manufacturing method thereof.

Additional objects, features, and strengths of the present invention will be made clear by the description below.

Further, the advantages of the present invention will be evident from the following explanation in reference to the drawings.

DESCRIPTION OF THE EMBODIMENTS

The following explains (i) a stack type semiconductor apparatus package according to one embodiment of the present invention, and (ii) a manufacturing method thereof, with reference to FIG. 1, and FIG. 6 to FIG. 15. Note that, for ease of understanding, a resin hatching is omitted in each of drawings of the present application.

Figure 1:
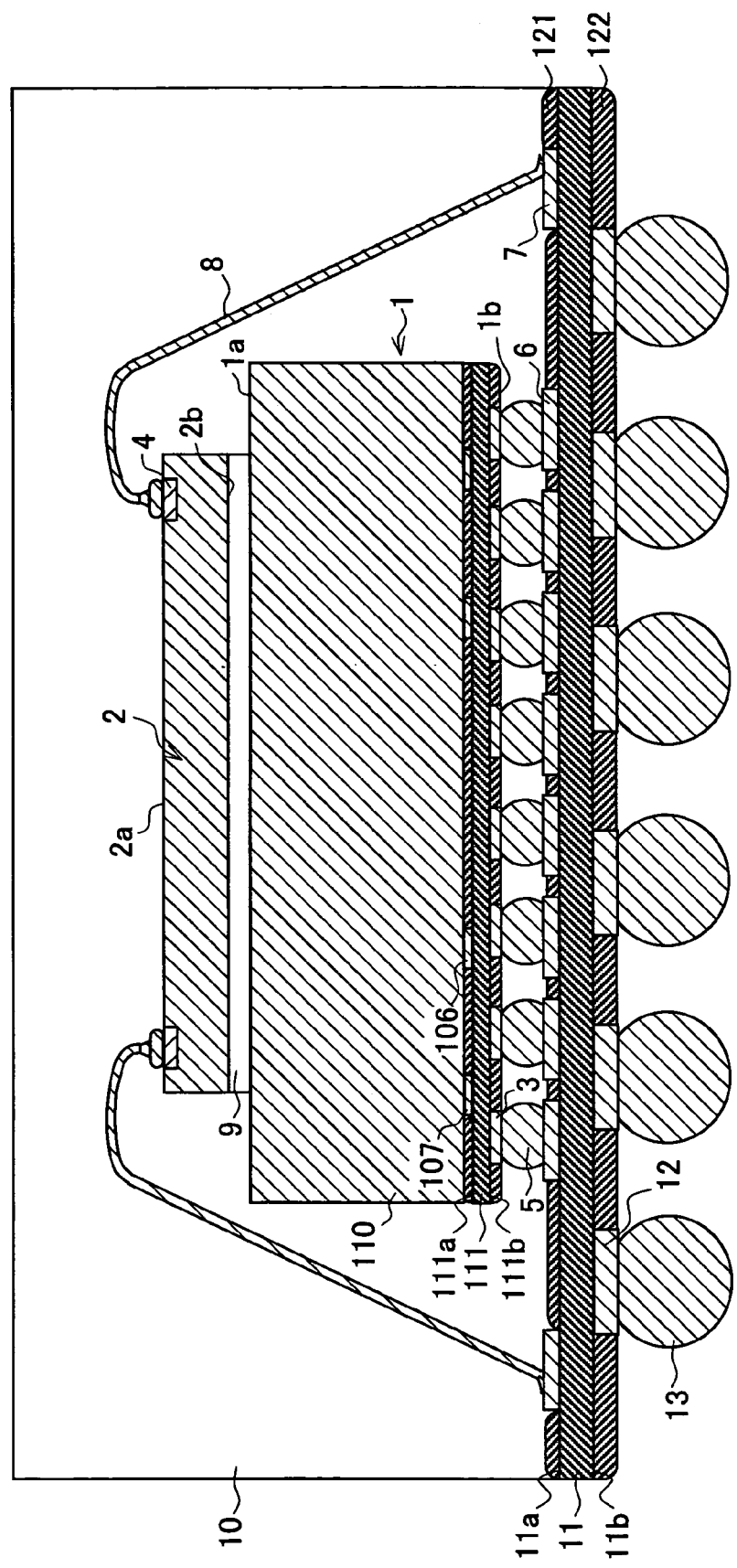
FIG. 1 is a cross sectional view illustrating a structure of a stack type semiconductor apparatus according to Embodiment 1 of the present invention.

FIG. 1 is a cross sectional view illustrating a stack type semiconductor apparatus package according to the present embodiment. As shown in FIG. 1, the stack type semiconductor apparatus package 100 according to the present embodiment includes: (i) an internal semiconductor apparatus package (semiconductor apparatus package) 1, (ii) at least one semiconductor apparatus (first semiconductor apparatus) 2 stacked on the internal semiconductor package 1, and (iii) a circuit substrate (first circuit substrate) 11 on which the internal semiconductor apparatus package 1 is mounted. The reference numeral "1" in FIG. 1 indicates an abstract internal package that never limits an internal structure thereof.

The internal semiconductor apparatus package 1 is provided between the semiconductor apparatus 2 and the circuit substrate 11. In the present embodiment, the internal semiconductor apparatus package 1 has a larger cross sectional face taken in an in-plane direction (a direction of a face 11b; hereinafter, referred to as "plane face direction") of the circuit substrate 11 than the semiconductor apparatus 2 does. Therefore, the internal semiconductor apparatus package 1 has a face 1a which faces the semiconductor apparatus 2 and which has a circumferential portion outside a region sandwiched between the semiconductor apparatus 2 and the circuit substrate 11. Note that the structure of the internal semiconductor apparatus package 1 will be described later. Note also that the internal semiconductor apparatus package 1 may have a smaller cross sectional face taken in the plane face direction than the semiconductor apparatus 2 does. The internal semiconductor apparatus package 1 includes a plurality of external input/output terminals (electrodes, connecting pads) 3. The external input/output terminals 3 are provided on a face of the internal semiconductor apparatus package 1, which face is toward the face 11a of the circuit substrate 11.

The semiconductor apparatus 2 is an IC (integrated circuit) chip having a face (element face) 2a on which a plurality of electrodes (first electrodes) 4 are provided, and which faces the internal semiconductor apparatus package 1.

The circuit substrate 11 has a larger cross sectional face taken in the in-plane direction (the direction of the second face 11b; hereinafter, referred to as "plane face direction") of the circuit substrate 11, than the internal semiconductor apparatus package 1 does. Therefore, the face (first face) 11a of the circuit substrate 11 has a circumferential portion outside a region overlapping with the internal semiconductor apparatus package 1. The face 11a is toward the internal semiconductor apparatus package 1.

The circuit substrate 11 is manufactured by forming through holes (not shown) in an insulating substrate. On the face (first face) 11a of the circuit substrate 11, there are provided (i) a plurality of first connecting pads 6, which are electrically connected to the corresponding external input/output terminals 3 of the internal semiconductor apparatus package 1, respectively; and (ii) a plurality of second connecting pads 7, which are electrically connected to the corresponding electrodes 4 of the semiconductor apparatus 2, respectively. The face 11a faces the internal semiconductor apparatus package 1.

The first connecting pads 6 are so provided as to respectively correspond to the external input/output terminals 3 of the internal semiconductor apparatus package 1. So, in this case, each of the first connecting pads 6 is provided on the face (first face) 11a of the circuit substrate 11, specifically, is provided on the region overlapping with the internal semiconductor apparatus package 1. The electric connecting of the first connecting pad 6 to each of the corresponding external input/output terminals 3 is normally carried out in accordance with the SMT (Surface Mount Technology). Moreover, in this case, the electric connecting uses solder balls serving as projection electrodes 5.

Each of the second connecting pads 7 is provided, on the periphery of the first connecting pad 6, on the face (first face) 11a of the circuit substrate 11, which face 11a is toward the internal semiconductor apparatus package 1. That is, the second connecting pad 7 is so provided on the first face 11a of the circuit substrate 11 as to be positioned on an outer side with respect to the first connecting pad 6. In this case, the second connecting pad 7 is provided in the circumferential portion (the region outside the region overlapping with the internal semiconductor apparatus package 1, on the face 11a) of the face (first face) 11a of the circuit substrate 11. The second connecting pads 7 are electrically connected to the corresponding electrodes 4 of the semiconductor apparatus 2 in accordance with the wire bonding method, respectively. More specifically, the electric connection is attained by respectively connecting the second connecting pads 7 and the electrodes 4 with each other by way of thin metal wires 8. Normally, each of the thin metal wires 8 is made from a gold wire, but can be made from other metals such as copper and aluminum.

Meanwhile, a plurality of external input/output terminals 12 (second external input/output terminals) are provided on the face (second face) 11b of the circuit substrate 11, which face 11b is a face reverse to the face 11a facing the internal semiconductor apparatus package 1. The external input/output terminals 12 are electrically connected to the first connecting pads 6 and the second connecting pads 7 via the through holes (not shown), respectively.

There are provided insulating films (insulating layers) 121 and 122 on the respective surfaces of the circuit substrate 11. In other words, the insulating film 121 is so provided on the face 11a of the circuit substrate 11 as to cover a region in which any of the first connecting pads 6 and the second connecting pads 7 are not provided. With this, the insulating film 121 serves as a solder resist for preventing solder flow-out occurring upon mounting of the semiconductor apparatus package in cases where the solder balls are used as the projection electrodes 5. On the other hand, the insulating film 122 is so provided on the face 11b of the circuit substrate 11 as to cover a region in which the external input/output terminals 12 are not provided. With this, the insulating film 122 serves as a solder resist for preventing solder flow-out occurring upon mounting of the semiconductor apparatus package in cases where solder balls are used as projection electrodes 13. Note that the insulating films 121 and 122 can be omitted according to respective shapes of the connecting pads 6 and the external input/output terminals 12.

The solder balls serving as the projection electrodes 13 are provided on the external input/output terminals 12, respectively.

The stack type semiconductor apparatus package 100 further includes a sealing resin (first resin) 10 for covering and sealing the semiconductor apparatus 2 and the internal semiconductor apparatus package 1. Note that the sealing resin 10 is also provided in a void between the internal semiconductor apparatus package 1 and the circuit substrate 11.

Further, the face (mold face) 1a of the internal semiconductor apparatus package 1 and the face (rear face) 2b of the semiconductor apparatus 2 are adhered with each other in at least one point, by way of an adhesive sheet (adhesive material) 9. The face 1a faces the semiconductor apparatus 2, and the face 2b faces the internal semiconductor apparatus package 1.

Figure 6:
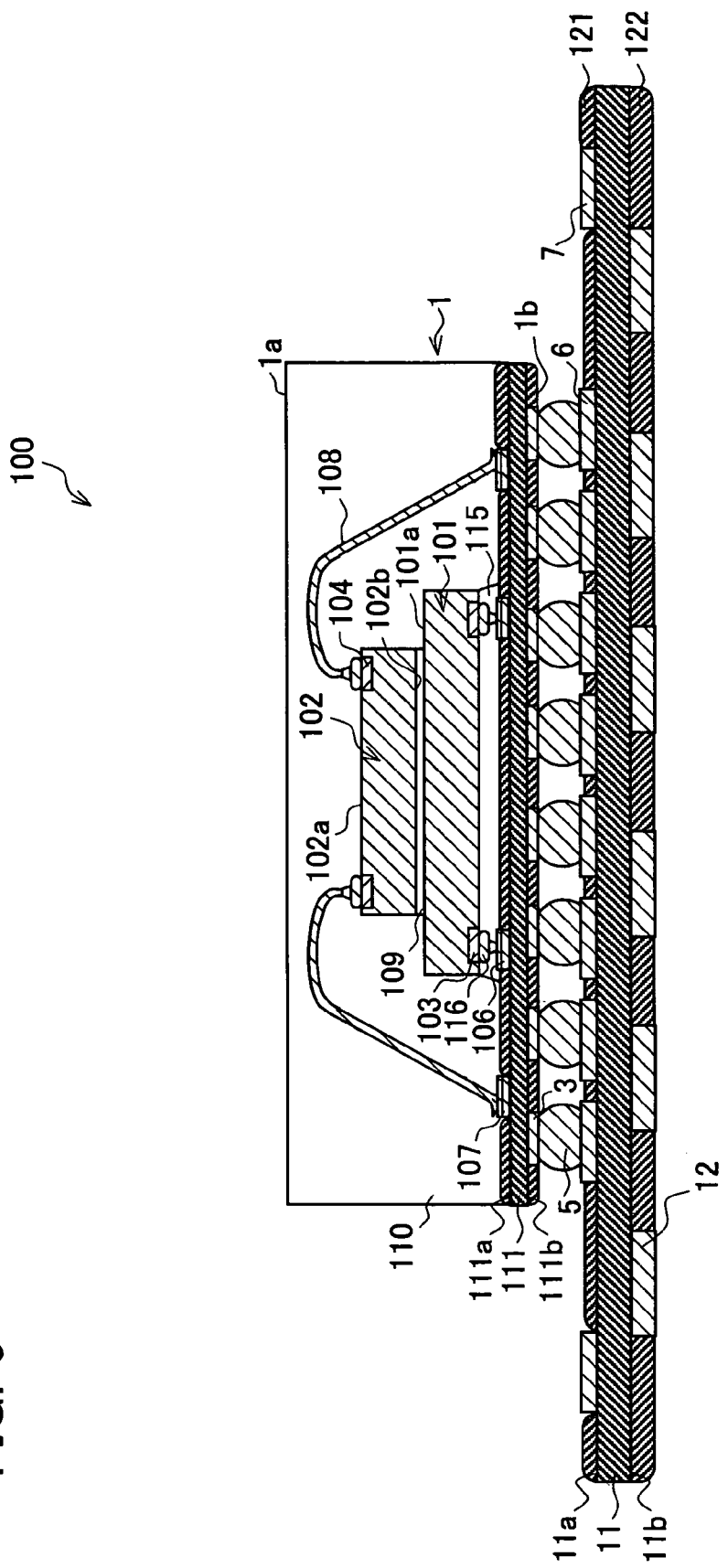
FIG. 6 is a cross sectional view illustrating the structure of the stack type semiconductor apparatus package according to Embodiment 1 of the present invention in a manufacturing step.

The following explains a specific example of the structure of the internal semiconductor apparatus package 1, with reference to FIG. 6. As shown in FIG. 6, the internal semiconductor apparatus package 1 of the present example includes: (i) the aforementioned external input/output terminals 3, (ii) a semiconductor apparatus (second semiconductor apparatus; IC chip) 101, (iii) a semiconductor apparatus 102 stacked on the semiconductor apparatus 101, and (iv) a circuit substrate (second circuit substrate) 111 on which the semiconductor apparatus 101 is mounted.

The semiconductor apparatus 101 is provided between the semiconductor apparatus 102 and the circuit substrate 111. The semiconductor apparatus 101 has a larger cross sectional face taken in an in-plane direction (a direction of a face 111b; hereinafter, referred to as "plane face direction") of the circuit substrate 111, than the semiconductor apparatus 102 does. Therefore, the semiconductor apparatus 101 has a face 101a which faces the semiconductor apparatus 102 and which has a circumferential portion outside a region sandwiched between the semiconductor apparatus 102 and the circuit substrate 111. Moreover, the semiconductor apparatus 101 is an IC chip having a face on which a plurality of electrodes (second electrodes) 103 are provided and which faces a face 111a of the circuit substrate 111.

The semiconductor apparatus 102 is an IC (integrated circuit) chip having a face (element face) 102a on which a plurality of electrodes (first electrodes) 104 are provided, and which is a face reverse to the face facing the semiconductor apparatus 101.

The circuit substrate 111 has a larger cross sectional face taken in the in-plane direction (the direction of the second face 111b; hereinafter, referred to as "plane face direction") of the circuit substrate 111, than the semiconductor apparatus 101 does. Therefore, the face 111a of the circuit substrate 111 has a circumferential portion outside a region overlapping with the semiconductor apparatus 101.

The circuit substrate 111 is manufactured by forming through holes (not shown) in an insulating substrate. On the face 111a of the circuit substrate 111, there are provided (i) a plurality of first connecting pads (third connecting pads) 106, which are electrically connected to the corresponding electrodes 103 of the semiconductor apparatus 101, respectively; and (ii) a plurality of second connecting pads 107, which are electrically connected to corresponding electrodes 104 of the semiconductor apparatus 102, respectively. The face 111a faces the semiconductor apparatus 101.

The first connecting pads 106 are so provided as to respectively correspond to the electrodes 103 of the semiconductor apparatus 101. So, in this case, each of the first connecting pads 106 is provided on the face (third face) 111a of the circuit substrate 111, specifically, is provided on the region overlapping with the semiconductor apparatus 101. The electric connecting of the first connecting pad 106 to each of the corresponding electrodes 103 of the semiconductor apparatus 101 is normally carried out in accordance with the flip chip method, by way of projection electrodes 116.

Each of the second connecting pads 107 is provided, on the periphery of the first connecting pad 106, on the face (first face) 111a of the circuit substrate 111, i.e., is provided in a position, on the face 111a, outer side with respect to the first connecting pad 106. In this case, the second connecting pad 107 is provided in the circumferential portion (region outside the region overlapping with the semiconductor apparatus 101) of the face (third face) 111*a* of the circuit substrate 111, which face 111*a* is toward the semiconductor apparatus 101. The second connecting pads 107 are electrically connected respectively to the corresponding electrodes 104 of the semiconductor apparatus 102 in accordance with the wire bonding method. More specifically, the electric connection is attained by respectively connecting the second connecting pads 107 and the electrodes 104 with each other by way of thin metal wires 108. Normally, each of the thin metal wires 108 is made from a gold wire, but can be made from other metals such as copper and aluminum.

Meanwhile, the external input/output terminals 3 (first external input/output terminals) are provided on the face (fourth face) 111*b* of the circuit substrate 111, which face 111*b* is a face reverse to the face 111*a* facing the semiconductor apparatus 101. The external input/output terminals 3 are electrically connected to the first connecting pads 106 and the second connecting pads 107 via the through holes (not shown), respectively.

There are provided insulating films on the respective surfaces of the circuit substrate 111; however the insulating films can be omitted according to respective shapes of the connecting pads 106 and the external input/output terminals 3.

The internal semiconductor apparatus package 1 further includes: (i) a sealing resin (second resin) 110 for covering and sealing the semiconductor apparatus 102 and the semiconductor apparatus 101; and (ii) a sealing resin 115, provided in a void between the semiconductor apparatus 101 and the circuit substrate 111.

Further, the face 101*a* of the semiconductor apparatus 101 and the face (rear face) 102*b* of the semiconductor apparatus 102 are adhered with each other in at least one point, by way of an adhesive sheet (adhesive material) 109. The face 101*a* faces the semiconductor apparatus 102, and the face 102*b* faces the semiconductor apparatus 101.

The internal semiconductor apparatus package 1 is either a memory package made up of a plurality of memories of the same type, or a complex memory package made up of a plurality of memories of different types. For example, the internal semiconductor apparatus package 1 is a complex memory package made up of (i) a SDRAM (Synchronous Dynamic Random Access Memory) serving as a memory element, and (ii) a flash memory. On the other hand, the semiconductor apparatus 2 is a DSP (Digital Signal Processor; digital signal processing circuit) serving as a logic element.

Note that the description here exemplifies the internal semiconductor apparatus package 1 (see FIG. 6) having the two semiconductor apparatuses, as the semiconductor apparatus package 1 (a type of BGA (ball grid array)) constituting the stack type semiconductor apparatus package of the present invention; however, any CSP (chip size package) package, any BGA package, or any LGA (land grid array) package, each of which includes at least one semiconductor apparatus, can be used as the semiconductor apparatus package 1. Internal semiconductor apparatus packages 1A to 1E respectively shown in FIG. 11 to FIG. 15 are specific examples of another semiconductor apparatus package that can be used to constitute the stack type semiconductor apparatus package of the present embodiment. For each of these internal semiconductor apparatus packages 1 and 1A to 1E, a general package can be used. A specific example of such a general package is a general internal semiconductor apparatus package 1 individually provided on a mount substrate 19 in such a manner shown in FIG. 10.

The internal semiconductor apparatus package 1A is a BGA or a CSP, each of which includes two semiconductor apparatuses. That is, the internal semiconductor apparatus package 1A has a complex memory structure in which semiconductor apparatuses each having a center pad are connected to each other in accordance with the flip chip method. An example of such semiconductor apparatuses includes a DRAM (Dynamic Random Access Memory).

The internal semiconductor package 1B is a BGA or a CSP, each of which includes two semiconductor apparatuses. That is, the internal semiconductor apparatus package 1B is a package in which semiconductor apparatuses having the same size are stacked on each other. For example, as the semiconductor apparatuses having the same size, two identical semiconductor apparatuses may be used to double the memory capacity. Alternatively, for simplicity of wiring in the circuit substrate 111, the following semiconductor apparatuses (i) and (ii) may be used: (i) one semiconductor apparatus, and (ii) the other semiconductor apparatus having a structure obtained by mirror-reversing the structure of the semiconductor apparatus.

The internal semiconductor apparatus package 1C is a BGA or a CSP, each of which includes one semiconductor apparatus. That is, the internal semiconductor apparatus package 1C is obtained by packaging a single semiconductor apparatus in accordance with the wire bonding method.

The internal semiconductor package 1D is a BGA or a CSP, each of which includes two semiconductor apparatuses. On the other hand, the internal semiconductor apparatus package 1E is a BGA or a CSP, each of which includes three semiconductor apparatuses. In each of the internal semiconductor apparatus packages, the semiconductor apparatuses are stacked on each other (one another) in accordance with only the wire bonding method. Note that the number of the stacked semiconductor apparatuses is not limited. Further, the internal semiconductor apparatus may be not only the complex memory package, but also a SiP (System in Package).

Further, in the internal semiconductor apparatus package 1, each of the external input/output terminals 3 never projects from the surface of the insulating film provided on the surface of the internal semiconductor apparatus package; however, by way of plating, the external input/output terminal 3 may be caused to project higher than the surface of the insulating film (e.g., the solder resist) provided on the surface of the internal semiconductor apparatus package. Inversely, each portion provided with the first connecting pad 6 may project higher than each portion provided with no first connecting pad 6 on the surface of the circuit substrate 11, which surface faces the internal semiconductor apparatus package 1.

Figure 7:
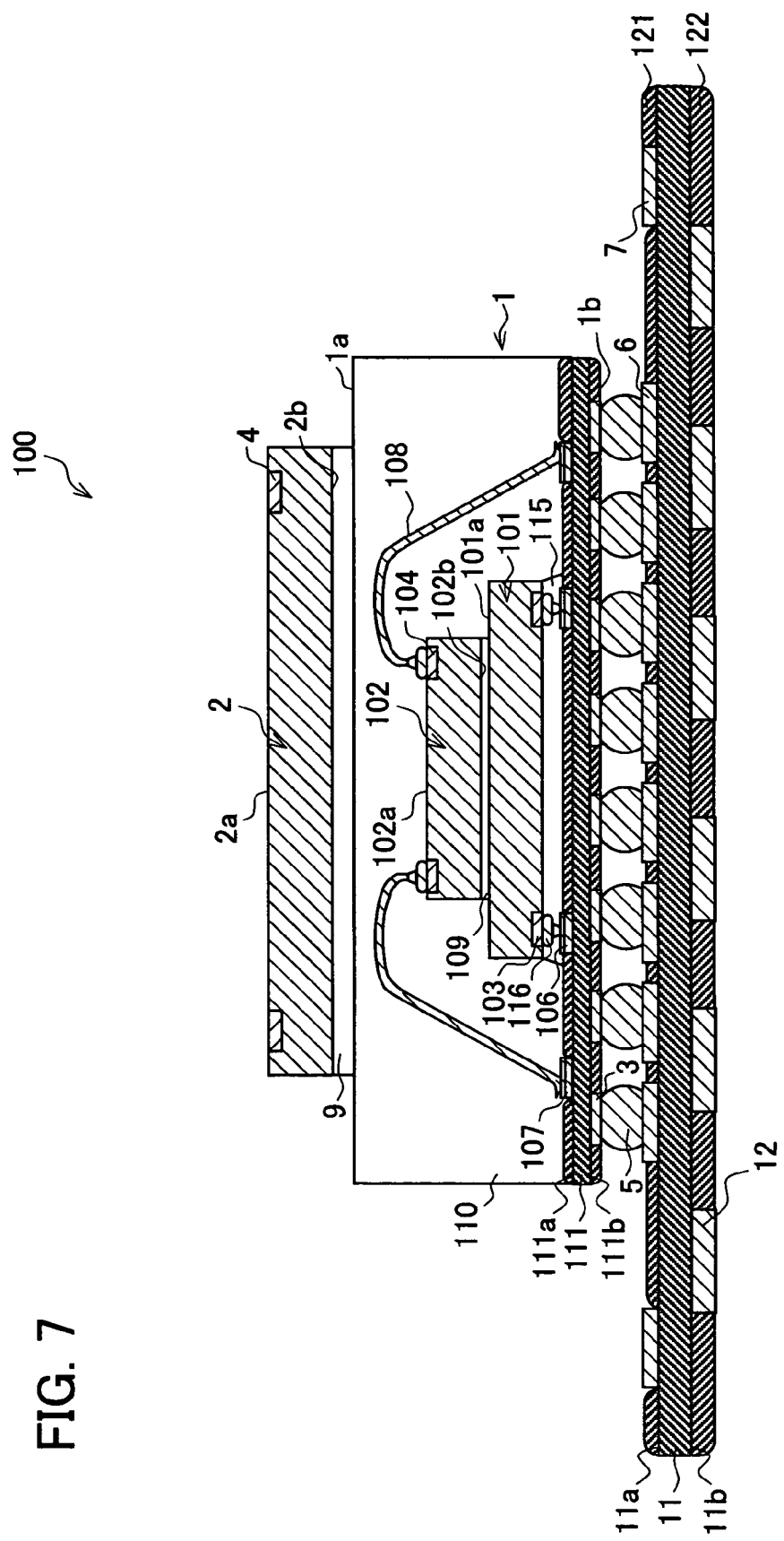
FIG. 7 is a cross sectional view illustrating the structure of the stack type semiconductor apparatus package according to Embodiment 1 of the present invention in another manufacturing step.
Figure 8:
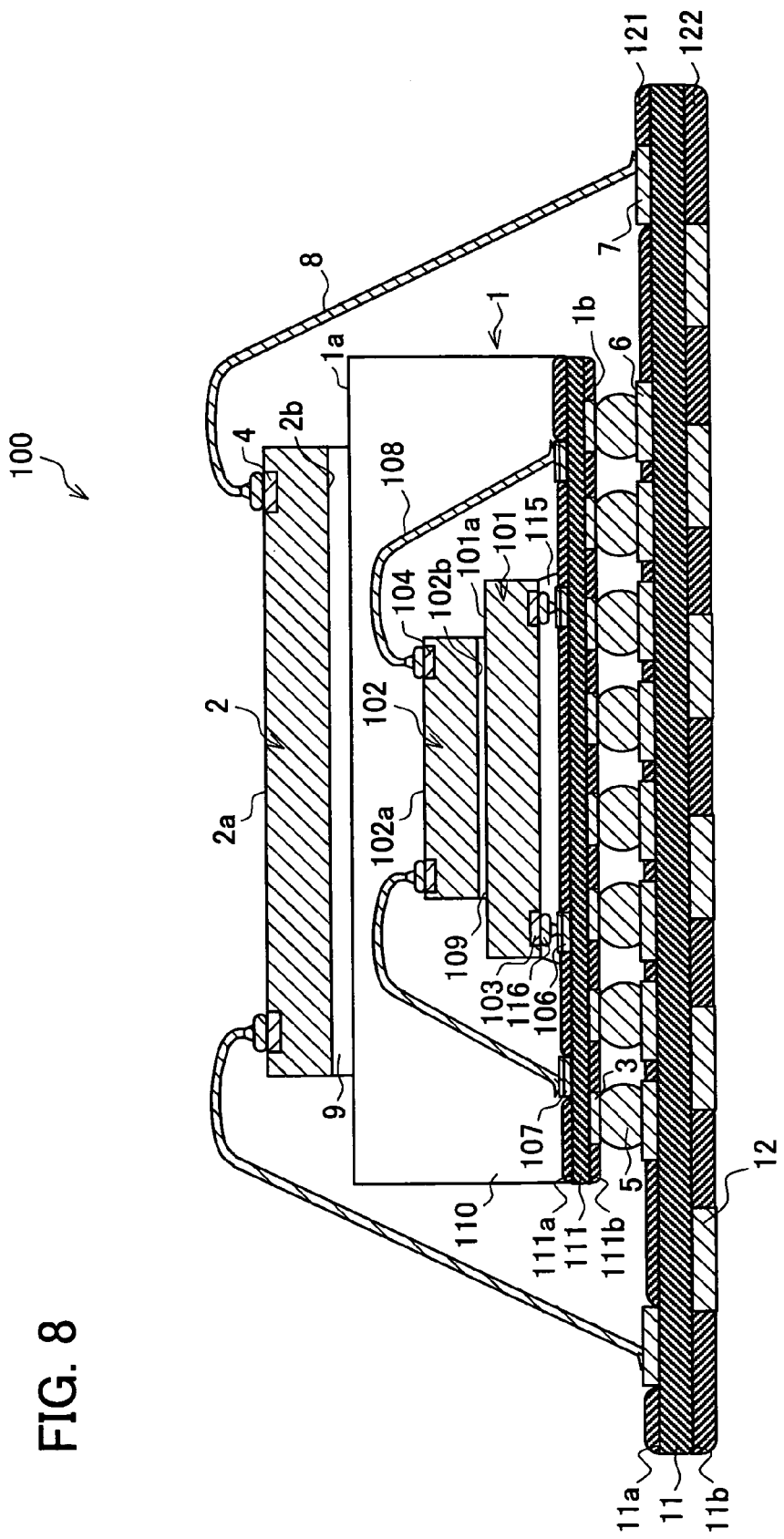
FIG. 8 is a cross sectional view illustrating the structure of the stack type semiconductor apparatus package according to Embodiment 1 of the present invention in still another manufacturing step.
Figure 9:
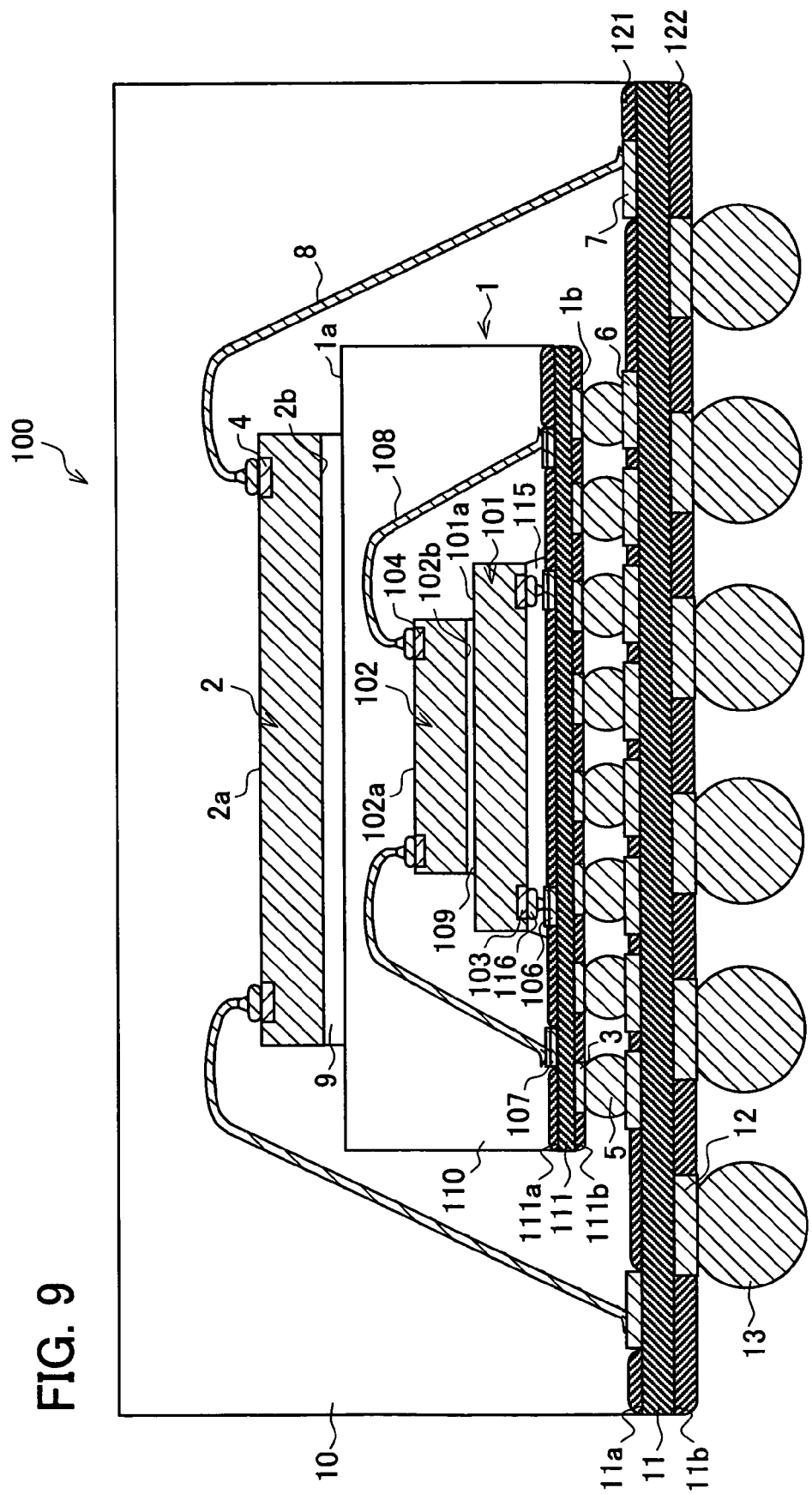
FIG. 9 is a cross sectional view illustrating the structure of the stack type semiconductor apparatus package according to Embodiment 1 of the present invention.
Figure 10:
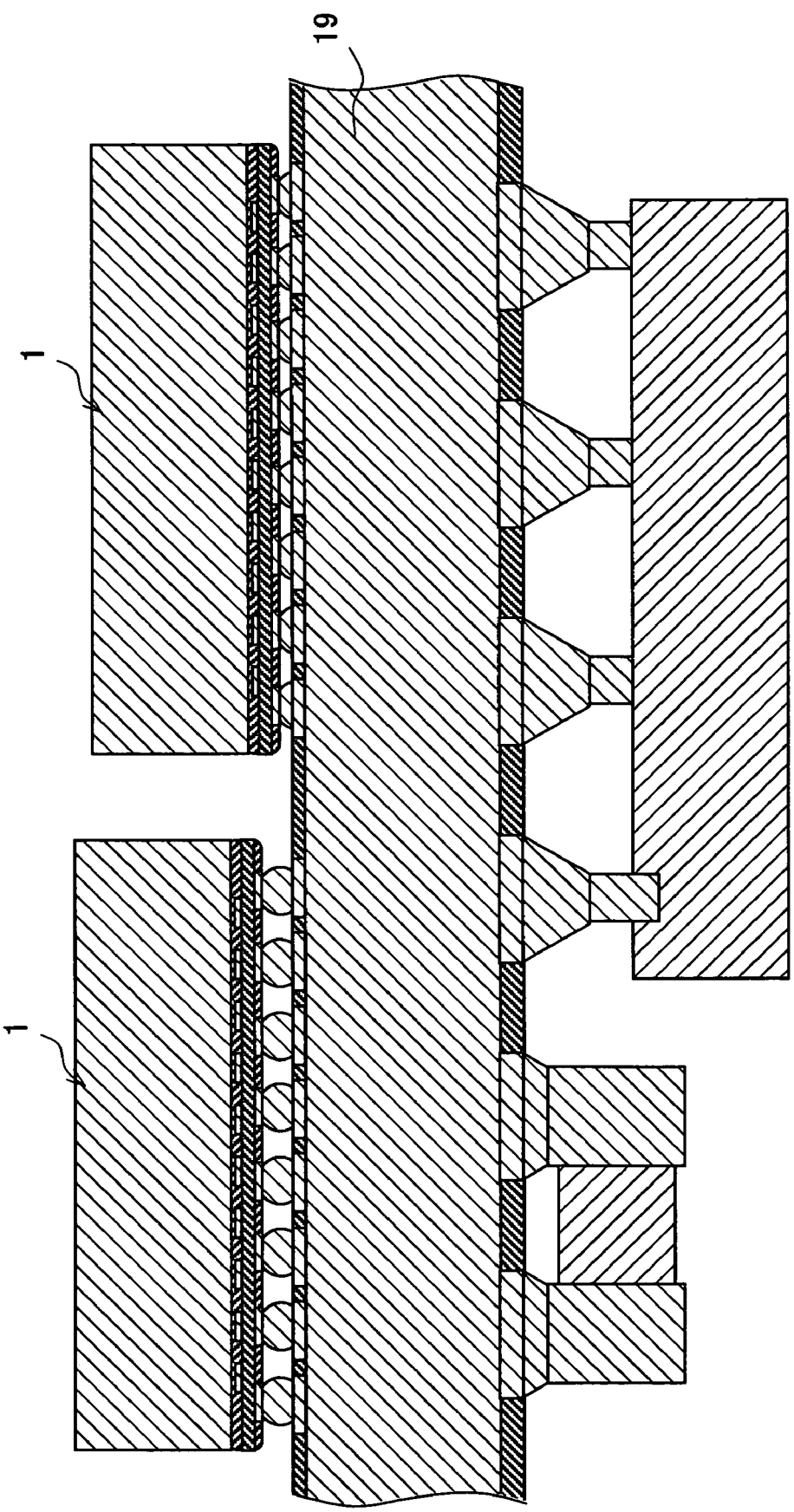
FIG. 10 is a cross sectional view illustrating an example in which the internal semiconductor apparatus package according to Embodiment 2 is mounted.
Figure 11:
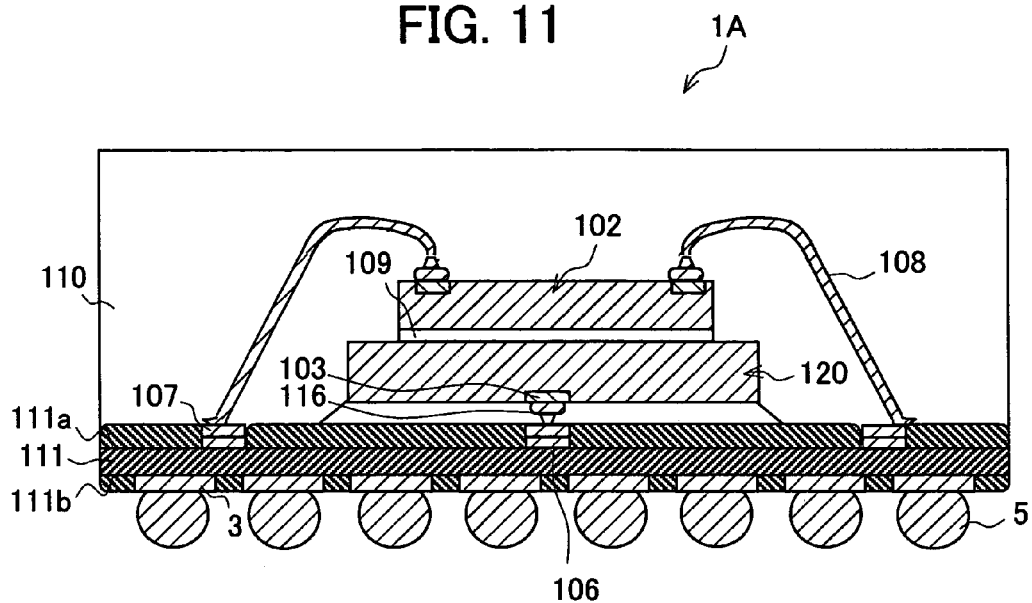
FIG. 11 is a cross sectional view illustrating a structure of an internal semiconductor apparatus package according to one embodiment of the present invention.
Figure 12:
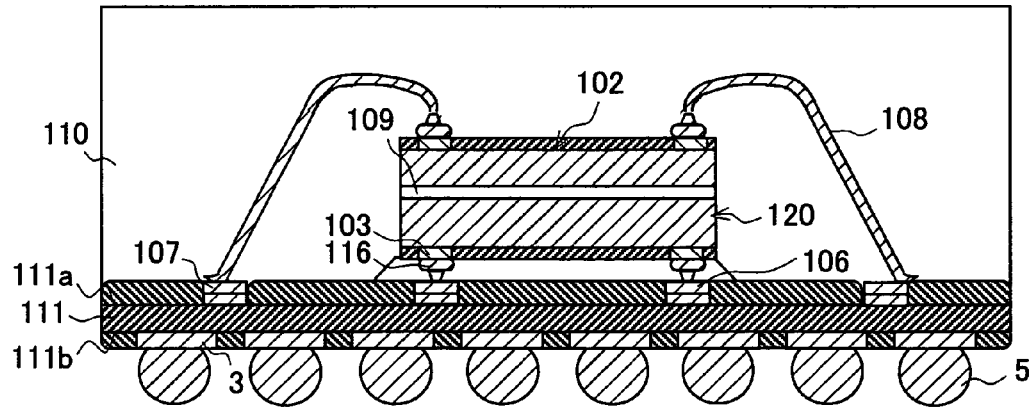
FIG. 12 is a cross sectional view illustrating a structure of an internal semiconductor apparatus package according to one embodiment of the present invention.
Figure 13:
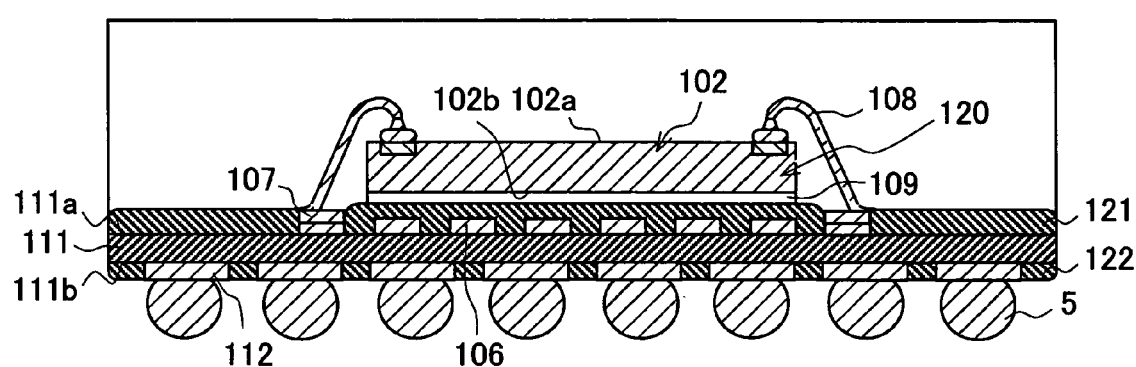
FIG. 13 is a cross sectional view illustrating a structure of an internal semiconductor apparatus package according to one embodiment of the present invention.
Figure 14:
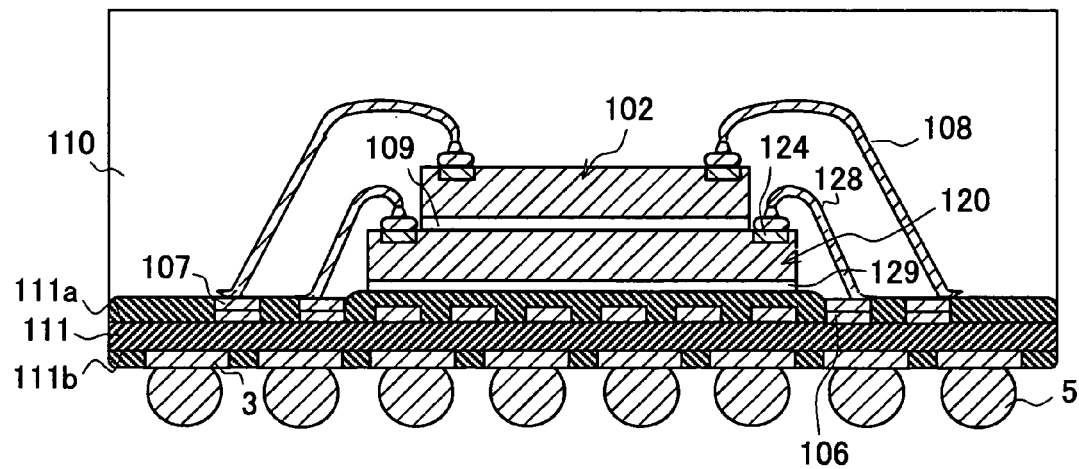
FIG. 14 is a cross sectional view illustrating a structure of an internal semiconductor apparatus package according to one embodiment of the present invention.

Explained next is an example of a method for manufacturing the stack type semiconductor apparatus package 100 shown in FIG. 1, with reference to FIG. 6 to FIG. 9. Each of FIG. 6 to FIG. 8 is a cross sectional view illustrating the structure of the stack type semiconductor apparatus package according to the present embodiment, in each manufacturing step. FIG. 9 is a cross sectional view illustrating one example of the product stack type semiconductor apparatus package according to the present embodiment.

Firstly carried out is preparation of (i) the internal semiconductor apparatus package 1 and (ii) the circuit substrate 11, on which the first connecting pads 6 and the second connecting pads 7, and the insulating films 121 and 122 are provided. The internal semiconductor apparatus package 1 and the circuit substrate 11 can be manufactured in accordance with various well-known methods described in the aforementioned patent document 1 and the like.

See FIG. 6. Carried out next is connecting of the external input/output terminals 3 to the first connecting pads 6 provided on the circuit substrate 11, by using the solders. In this case, the connecting uses the solder balls as the projection electrodes 5, with the result that the first connecting pads 6 are connected to the external input/output terminals 3 via the solders, respectively.

The following methods (1) to (5) can be adopted as a method for attaining the connection.

(1) A solder paste is printed on each of the first connecting pads 6. Then, the first connecting pad 6 is aligned with each of the solder balls that serve as the projection electrodes 5, and that are respectively provided in advance on the external input terminals 3 of the internal semiconductor apparatus package 1. Thereafter, the internal semiconductor apparatus package 1 is mounted (installed) on the circuit substrate 11. Then, the internal semiconductor apparatus package 1 thus mounted on the circuit substrate 11 is heated in a reflow oven such that the solder paste and the solder balls (projection electrodes 5) are melted. Reflow thus caused allows realization of the connection.

(2) A solder paste is printed on each of the first connecting pads 6, and the first connecting pad 6 is aligned with each of the external input/output terminals 3 (land of the LGA) of the internal semiconductor apparatus package 1 having the LGA structure, in which the solder balls serving as the projection electrodes 5 are not respectively provided in advance on the external input/output terminals 3. Then, the internal semiconductor apparatus package 1 is mounted on the circuit substrate 11. The internal semiconductor apparatus package 1 thus mounted on the circuit substrate 11 is heated in a reflow oven such that the solder paste is melted. Reflow thus caused allows realization of the connection.

(3) A flux is applied to each of the first connecting pads 6. Then, the first connecting pad 6 is aligned with each of the solder balls that serve as the projection electrodes 5, and that are respectively provided in advance on the external input terminals 3 of the internal semiconductor apparatus package 1. Thereafter, the internal semiconductor apparatus package 1 is mounted (installed) on the circuit substrate 11. Then, the internal semiconductor apparatus package 1 thus mounted on the circuit substrate 11 is heated in a reflow oven such that the solder balls (projection electrodes 5) are melted. Reflow thus caused allows realization of the connection.

(4) Each of the projection electrodes 5 (solder balls) of the internal semiconductor apparatus package 1, and each of the first connecting pads 6 provided on the circuit substrate 11 are connected with each other by tool bonding using a flip chip bonder, i.e., are connected by using heat and/or load.

(5) Each of the projection electrodes 5 (solder balls) of the internal semiconductor apparatus package 1, and each of the first connecting pads 6 provided on the circuit substrate 11 are connected with each other by tool bonding using a supersonic wave flip chip bonder, i.e., are connected by using only a supersonic wave, or by using the supersonic wave and heat and/or load.

Further, the following method (6) can be adopted in the case of manufacturing a stack type semiconductor apparatus package having the same structure as the structure of the stack type semiconductor apparatus package 100 shown in FIG. 1, except that gold bumps are provided as the projection electrodes 5 instead of the solder balls:

(6) Each of the projection electrodes 5 (gold bumps) of the internal semiconductor apparatus package 1, and each of the first connecting pads 6 provided on the circuit substrate 11 are connected with each other by the tool bonding using the supersonic wave flip chip bonder, i.e., are connected by using the supersonic wave, or by using the supersonic wave and heat and/or load.

Further, the following method (7) can be adopted in the case of manufacturing a stack type semiconductor apparatus package having the same structure as the structure of the stack type semiconductor apparatus package 100 shown in FIG. 1, except that no projection electrode 5 is provided:

(7) Plating is carried out so as to project each of the external input/output terminals 3 of the internal semiconductor apparatus package 1 higher than the surface of the insulating film (solder resist or the like) provided on the surface of the internal semiconductor apparatus package 1. The external input/output terminal 3 of the internal semiconductor apparatus package 1, and each of the first connecting pads 6 provided on the circuit substrate 11 are connected with each other by the tool bonding using the supersonic wave flip chip bonder, i.e., are connected by using the supersonic wave, or by using the supersonic wave and heat and/or load.

This method does not use the projection electrodes 5, but allows realization of the connection between the external input/output terminal 3 and the first connecting pad 6.

Next, as shown in FIG. 7, the semiconductor apparatus 2 is adhered to the upper face (the face reverse to the face on which the external input/output terminals 3 are provided) of the internal semiconductor apparatus package 1 by way of the adhesive material. In FIG. 7, the adhering is carried out in the following manner. That is, the adhesive sheet (adhesive material) 9 is provided in advance on the rear face (the face reverse to the face on which the electrodes 4 are provided) of the semiconductor apparatus 2, and then the semiconductor apparatus 2 is mounted on the upper face of the internal semiconductor apparatus package 1, and heat is applied thereto so as to adhere the semiconductor apparatus 2 to the upper face of the internal semiconductor apparatus package 1. However, the adhering method using the adhesive material is not limited to the above method, and the adhering may be carried out as follows. That is, the adhesive sheet 9 is adhered to the upper face (the face reverse to the face on which the external input/output terminals 3 are provided), and then the semiconductor apparatus 2 is mounted on the adhesive sheet 9, and then heat is applied thereto so as to adhere the semiconductor apparatus 2 to the upper face of the internal semiconductor apparatus package 1. Moreover, instead of the adhesive sheet 9, a liquid adhesive resin (liquid adhesive material, adhesive material) 14 may be used to adhere the semiconductor apparatus 2 to the upper face of the internal semiconductor apparatus package 1, as is the case with a stack type semiconductor apparatus package (see FIG. 2) described later.

Next, as shown in FIG. 8, the thin metal wires 8 are used to electrically connect (i) the electrodes 4 of the semiconductor apparatus 2 thus mounted, to (ii) the second connecting pads 7 provided on the circuit substrate 11, respectively.

Thereafter, as shown in FIG. 9, the heat-curing sealing resin 10 is used to seal the entire components installed in the stack type semiconductor apparatus package. The entire components include the internal semiconductor apparatus package 1, the semiconductor apparatus 2, and the thin metal wires 8. The sealing may be carried out in accordance with the transfer mold method using a resin pellet, or with a method of potting a liquid resin.

Finally, as shown in FIG. 9, the solder balls serving as the projection electrodes 13 are respectively provided on (i) the external input/output terminals 12 electrically connected to the first connecting pads 6, and (ii) the external input/output terminals 12 electrically connected to the second connecting pads 7. Note that this process is carried out so as to allow the stack type semiconductor apparatus package to be a BGA package. For this reason, in cases where the stack type semiconductor apparatus package is to be a LGA package, the process is not required.

Embodiment 2

The following description deals with (i) a stack type semiconductor apparatus package according to another embodiment of the present invention, and (ii) a manufacturing method thereof with reference to FIG. 2, and FIG. 10 to FIG. 20. For ease of explanation, materials having the equivalent functions as those shown in the drawings pertaining to the foregoing Embodiment 1 will be given the same reference symbols, and explanation thereof will be omitted here.

Figure 2:
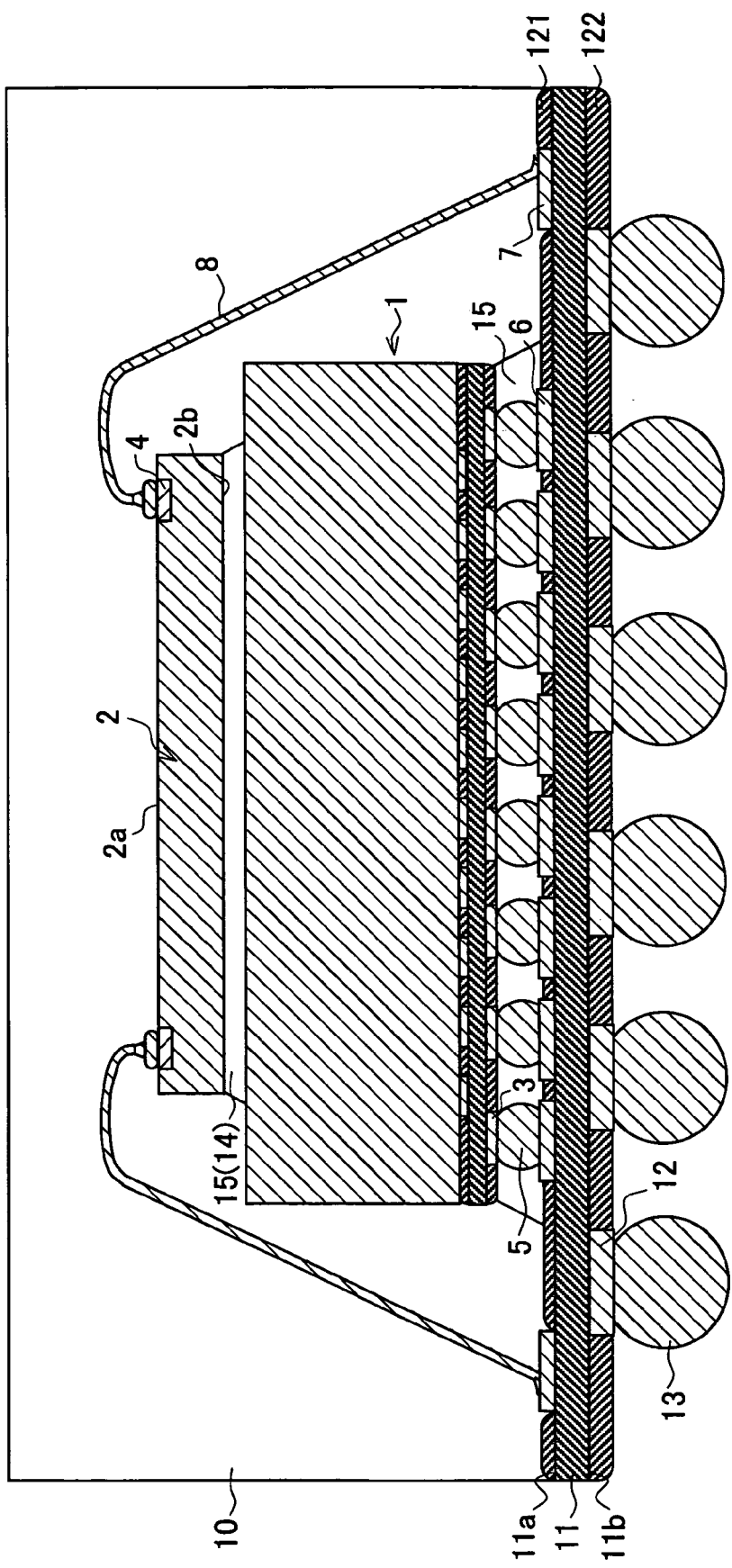
FIG. 2 is a cross sectional view illustrating a structure of a stack type semiconductor apparatus according to Embodiment 2 of the present invention.

FIG. 2 is a cross sectional view illustrating the stack type semiconductor apparatus package according to the present embodiment. As shown in FIG. 2, the stack type semiconductor apparatus package according to the present embodiment have the same structure as the structure of the stack type semiconductor apparatus package 100 according to Embodiment 1, except that: (1) instead of the adhesive sheet 9, a liquid resin (liquid adhesive material, adhesive material, third resin) 15 is provided as the adhesive material for adhering the internal semiconductor apparatus package 1 and the semiconductor apparatus 2 together; and (2) instead of the sealing resin 10, a cured liquid resin (third resin) 15 is provided in the void between the internal semiconductor apparatus package 1 and the circuit substrate 11.

A low hygroscopic epoxy or the like can be used as the sealing resin 10 for covering the semiconductor apparatus 2 and the internal semiconductor apparatus package 1. Further, use of a mold resin conventionally used for a general LSI package allows realization of an assembly process that matches well with a prevail process.

Examples of the liquid resin 15 provided in the void between the internal semiconductor apparatus package 1 and the circuit substrate 11 include: a heat curing resin such as an epoxy, and an under-fill material for use in the flip chip and the CSP.

Any CSP package, any BGA package, or any LGA package, each of which includes at least one semiconductor apparatus, can be used as the semiconductor apparatus package 1, which constitutes the stack type semiconductor apparatus package of the present embodiment. The internal semiconductor apparatus package 1 shown in FIG. 6, and the internal semiconductor apparatus packages 1A to 1E respectively shown in FIG. 11 to FIG. 15 are specific examples of the semiconductor apparatus package that can be used in the present embodiment. For each of the internal semiconductor apparatus packages 1 and 1A to 1E, a general package can be used. A specific example of such a general package is the general internal semiconductor apparatus package 1 individually provided on the mount substrate 19 in such a manner shown in FIG. 10.

See a reference numeral "15 (14)" in FIG. 2. Here, the liquid resin 15 is used as the liquid adhesive material; however, instead of the liquid resin 15, a liquid adhesive resin (liquid adhesive material, adhesive material) 14 different from the liquid resin 15 can be used as the liquid adhesive material. Further, instead of such liquid adhesive materials, the adhesive sheet (adhesive material) 9 described in Embodiment 1 can be used.

Explained next is an example of a method for manufacturing the stack type semiconductor apparatus package shown in FIG. 2, with reference to FIG. 16 to FIG. 20. Each of FIG. 16 to FIG. 19 is a cross sectional view illustrating the structures of the stack type semiconductor apparatus package according to the present embodiment, in each manufacturing step. FIG. 20 is a cross sectional view illustrating one example of the product stack type semiconductor apparatus package according to the present embodiment. Note that FIG. 16 to FIG. 20 each describe a case where the aforementioned internal semiconductor apparatus package 1D is used as the internal semiconductor apparatus 1.

Firstly carried out is preparation of (i) the internal semiconductor apparatus package 1 and (ii) the circuit substrate 11, on which the first connecting pads 6, the second connecting pads 7, and the insulating films 121 and 122 are provided. The internal semiconductor apparatus package 1 and the circuit substrate 11 can be manufactured in accordance with various well-known methods described in the aforementioned patent document 1 and the like.

Figure 16:
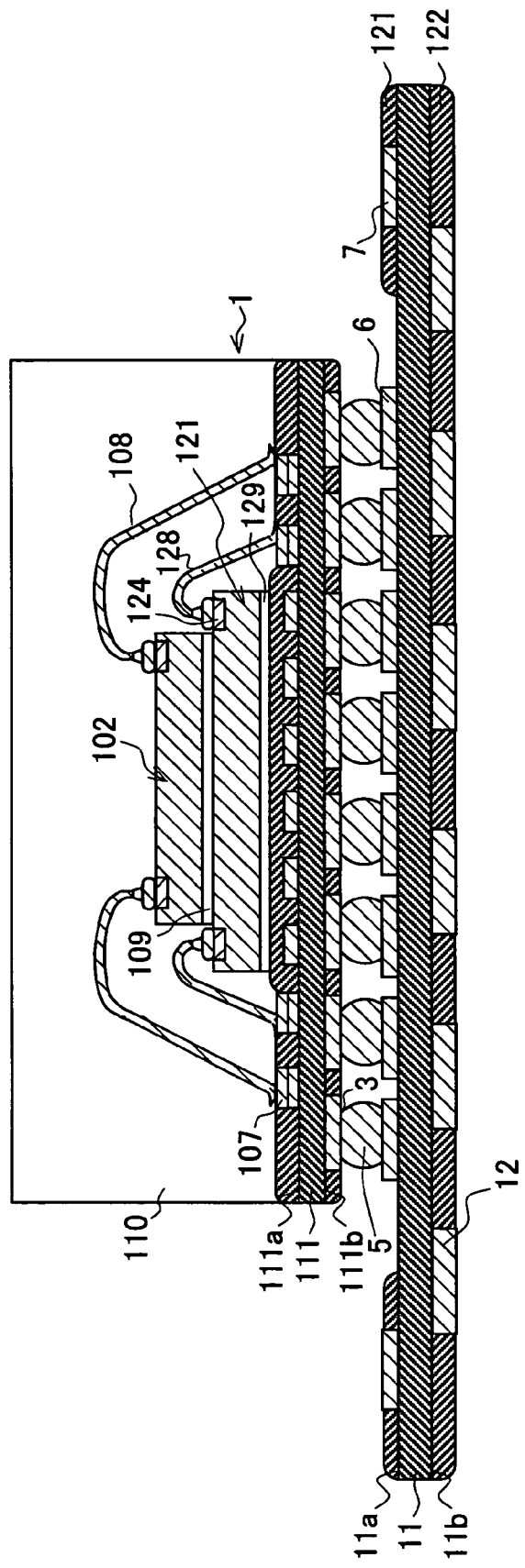
FIG. 16 is a cross sectional view illustrating the structure of the stack type semiconductor apparatus package according to Embodiment 2 of the present invention in a manufacturing step.

See FIG. 16. Carried out next is connecting of the external input/output terminals 3 to the respective first connecting pads 6 provided on the circuit substrate 11 by using the projection electrodes 5. In this case, the connecting uses the solder balls as the projection electrodes 5, so that the first connecting pads 6 are connected to the external input/output terminals 3 via the solders, respectively.

The methods (1) to (5) described in Embodiment 1 can be adopted for the method for attaining the connection.

Further, the method (6) described in Embodiment 1 can be adopted in the case of manufacturing a stack type semiconductor apparatus package having the same structure as the structure of the stack type semiconductor apparatus package shown in FIG. 1, except that gold bumps are provided as the projection electrodes 5 instead of the solder balls. Further, the method (7) described in Embodiment 1 can be adopted in the case of manufacturing a stack type semiconductor apparatus package having the same structure as the structure of the stack type semiconductor apparatus package shown in FIG. 1, except that no projection electrode 5 is provided. The method (7) does not use the projection electrodes 5, but allows realization of the connection between each of the external input/output terminals 3 and each of the first connecting pads 6.

Figure 17:
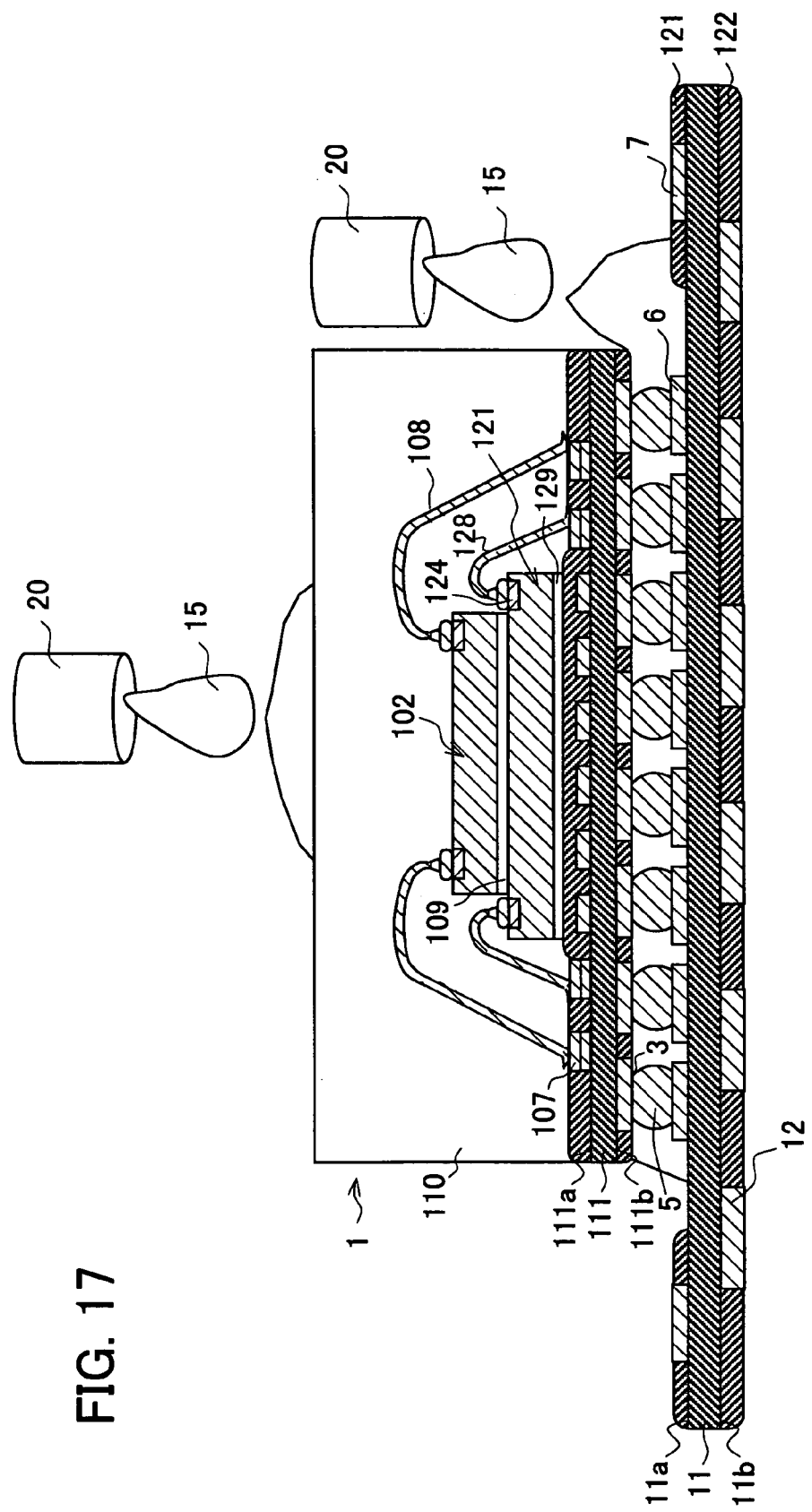
FIG. 17 is a cross sectional view illustrating the structure of the stack type semiconductor apparatus package according to Embodiment 2 of the present invention in another manufacturing step.

Next, as shown in FIG. 17, a dispenser 20 is used to apply an uncured liquid resin 15 to the upper face (the face reverse to the face on which the external input/output terminals 3 are provided) of the internal semiconductor apparatus package 1. Such an uncured liquid resin 15 is also so applied as to fill the void between the internal semiconductor apparatus package 1 and the circuit substrate 11. As the liquid resin 15, an uncured heat curing resin can be used.

Figure 18:
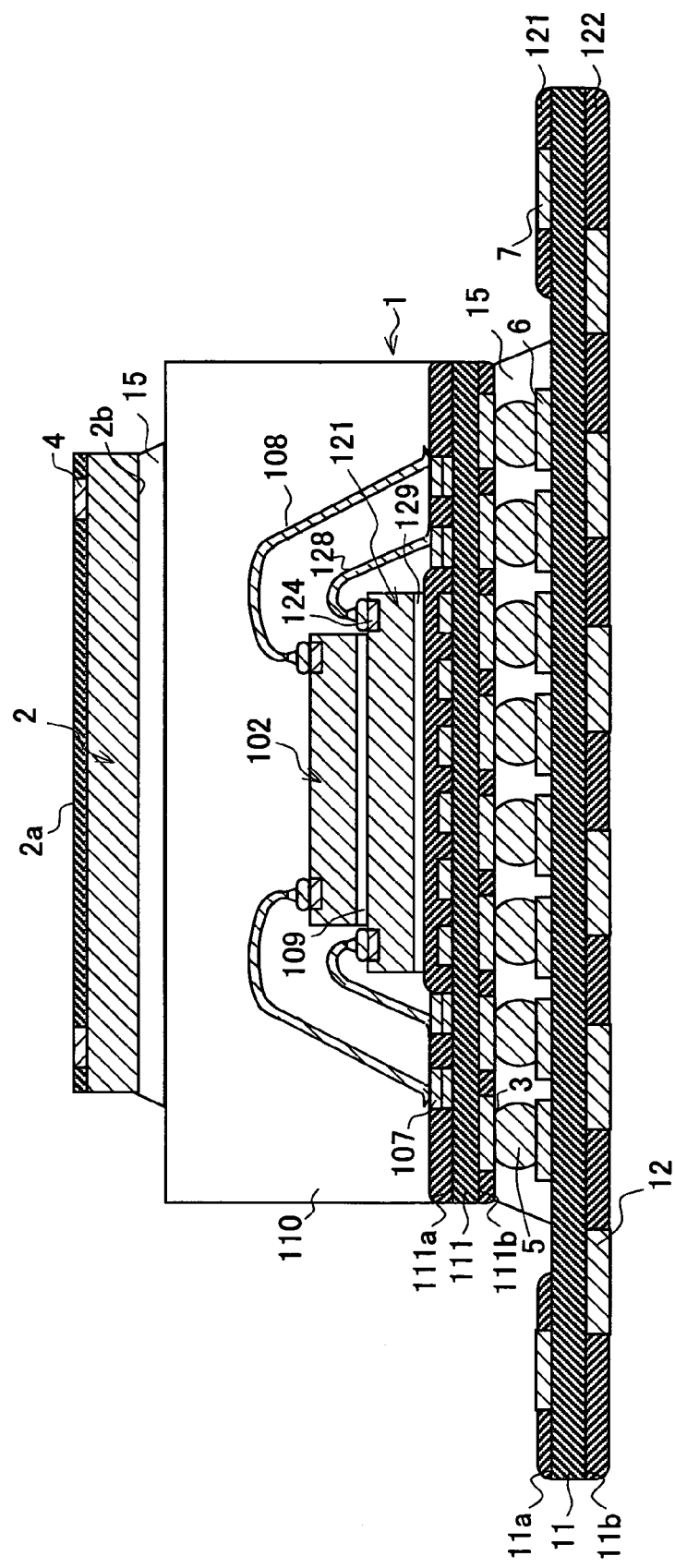
FIG. 18 is a cross sectional view illustrating the structure of the stack type semiconductor apparatus package according to Embodiment 2 of the present invention in still another manufacturing step.

Next, as shown in FIG. 18, the semiconductor apparatus 2 is mounted (installed) on the internal semiconductor apparatus package 1 with the liquid resin 15 therebetween, and heating is carried out thereto with the use of an oven or the like so as to cure the liquid resin 15. The curing of the liquid resin 15 causes the semiconductor apparatus 2 to be adhered to the upper face (the face reverse to the face on which the external input/output terminals 3 are provided) of the internal semiconductor apparatus package 1. Also cured on this occasion is the liquid resin 15 filling the void between the internal semiconductor apparatus package 1 and the circuit substrate 11. Note that, in cases where the liquid adhesive resin (liquid adhesive material, adhesive material) 14 different from the liquid resin 15 is used instead of the liquid resin 15 provided between the semiconductor apparatus 2 and the internal semiconductor apparatus package 1, application of the liquid adhesive resin 14 may be carried out before or after the application of the liquid resin 15 provided in the void between the internal semiconductor apparatus package 1 and the circuit substrate 11, and curing of the liquid adhesive resin 14 may be carried out before or after the curing of the liquid resin 15 provided in the void.

Figure 19:
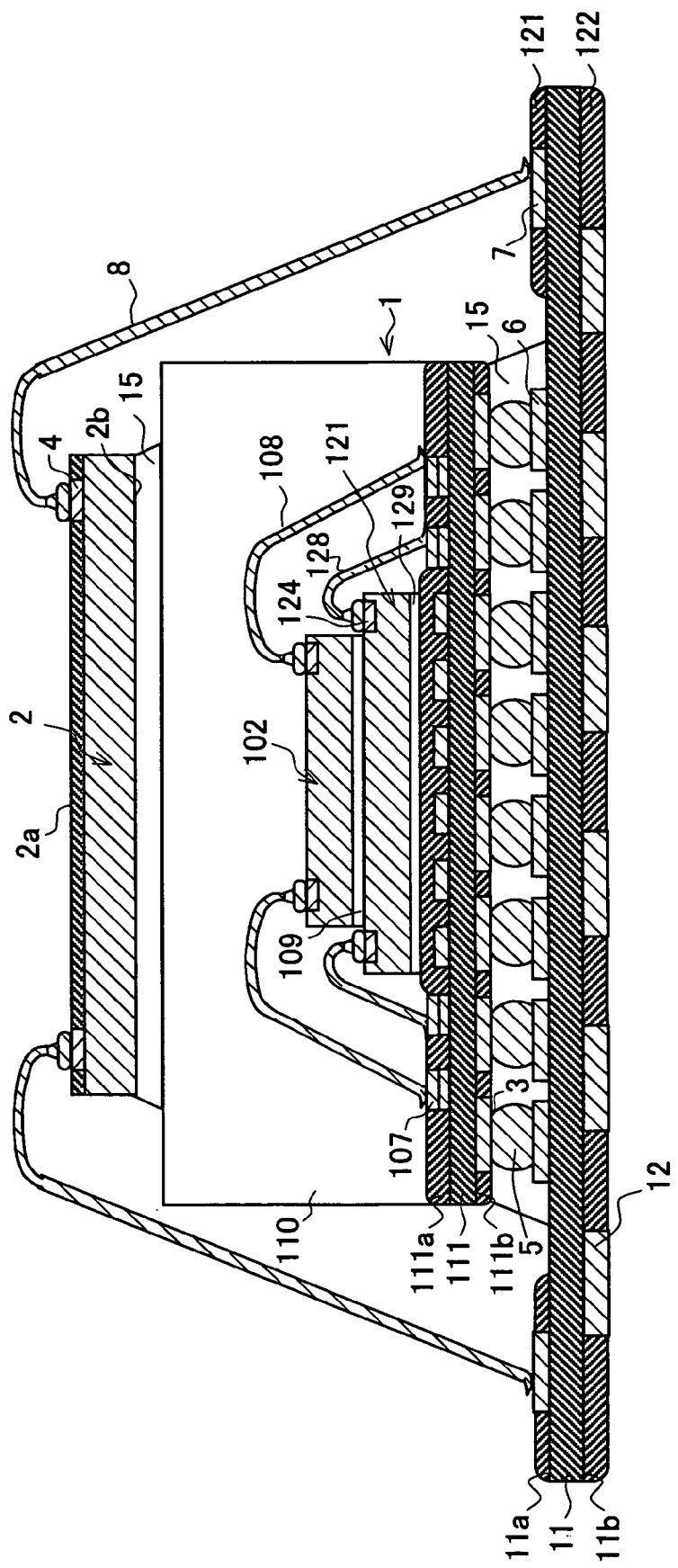
FIG. 19 is a cross sectional view illustrating the structure of the stack type semiconductor apparatus package according to Embodiment 2 of the present invention in yet another manufacturing step.
Figure 20:
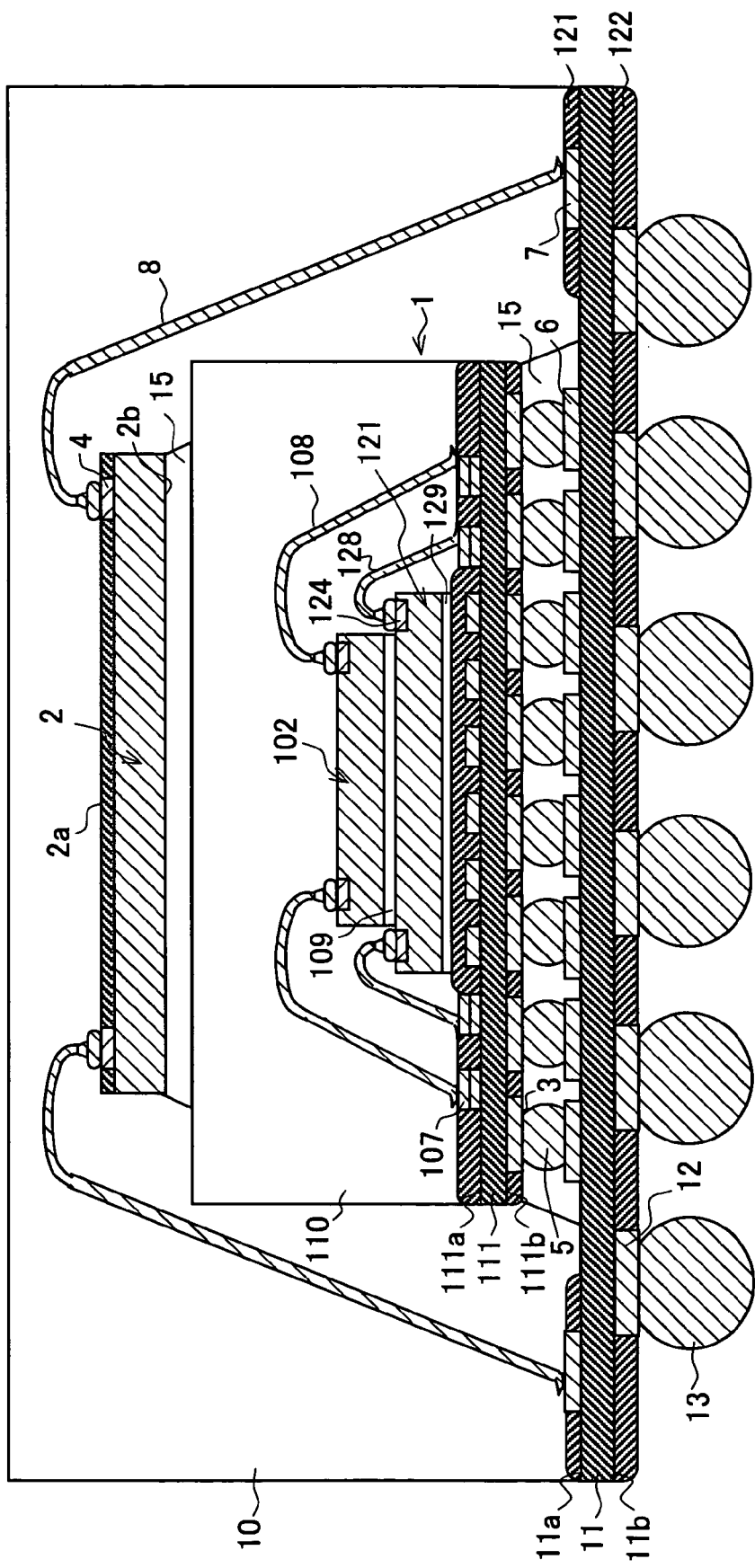
FIG. 20 is a cross sectional view illustrating the structure of the stack type semiconductor apparatus package according to Embodiment 2 of the present invention.

Next, as shown in FIG. 19, the thin metal wires 8 are used to electrically connect (i) the electrodes 4 of the semiconductor apparatus 2 thus mounted, to (ii) the second connecting pads 7 provided on the circuit substrate 11, respectively.

Thereafter, as shown in FIG. 20, the heat-curing sealing resin 10 is used to seal the entire components installed in the stack type semiconductor apparatus package. The entire components include the internal semiconductor apparatus package 1, the semiconductor apparatus 2, and the thin metal wires 8. The sealing may be carried out in accordance with the transfer mold method using a resin pellet, or with the method of potting a liquid resin.

Finally, as shown in FIG. 20, the solder balls serving as the projection electrodes 13 are respectively provided on (i) the external input/output terminals 12 electrically connected to the first connecting pads 6, and (ii) the external input/output terminals 12 electrically connected to the second connecting pads 7. Note that this process is carried out so as to allow the stack type semiconductor apparatus package to be a BGA package. For this reason, in cases where the stack type semiconductor apparatus package is to be a LGA package, the process is not required.

Embodiment 3

The following description deals with (i) a stack type semiconductor apparatus package according to still another embodiment of the present invention, and (ii) a manufacturing method thereof with reference to FIG. 3, FIG. 10, FIG. 11, and FIG. 21 to FIG. 26. For ease of explanation, materials having the equivalent functions as those shown in the drawings pertaining to the foregoing Embodiment 1 or 2 will be given the same reference symbols, and explanation thereof will be omitted here.

Figure 3:
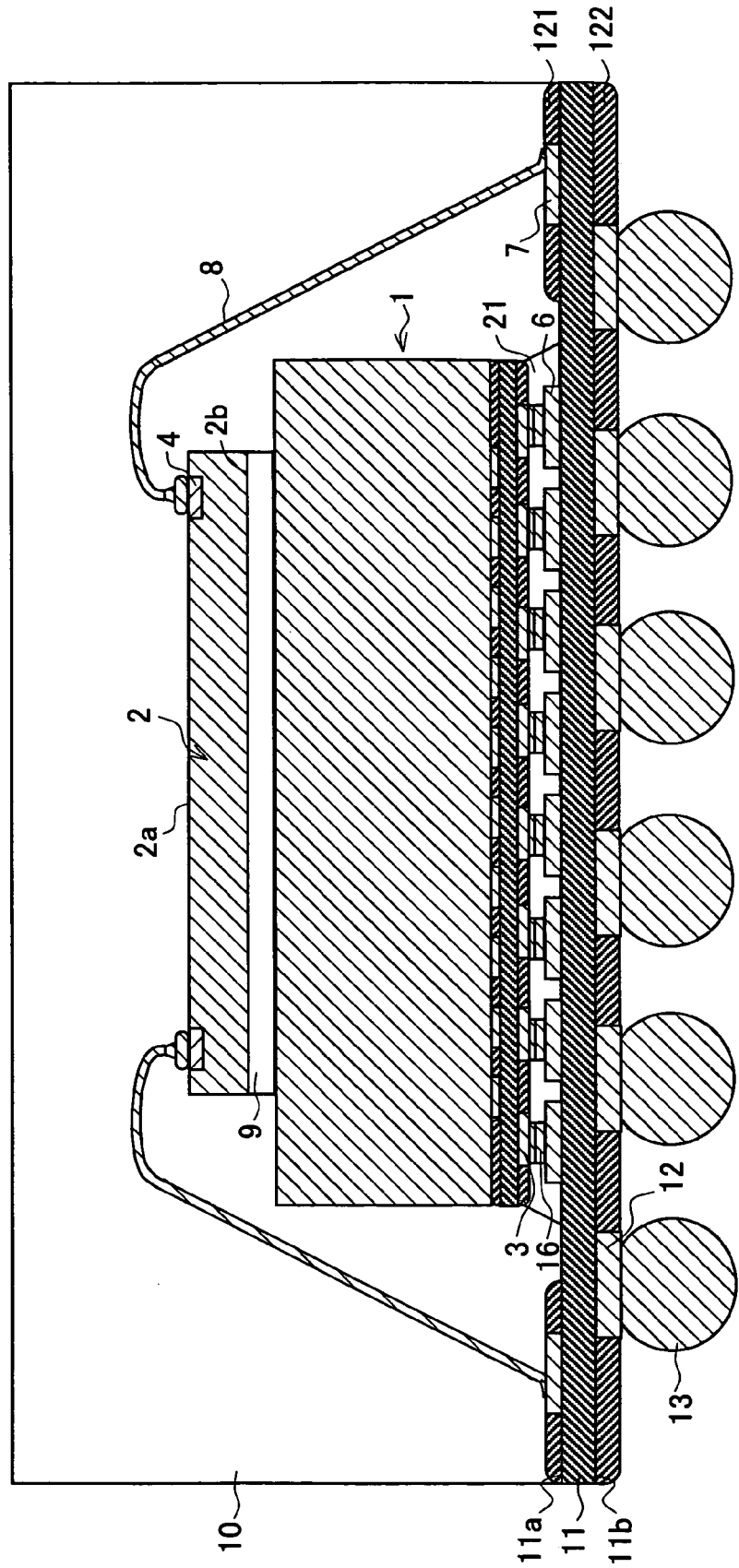
FIG. 3 is a cross sectional view illustrating a structure of a stack type semiconductor apparatus according to Embodiment 3 of the present invention.

FIG. 3 is a cross sectional view illustrating the stack type semiconductor apparatus package according to the present embodiment. As shown in FIG. 3, the stack type semiconductor apparatus package according to the present embodiment have the same structure as the structure of the stack type semiconductor apparatus package according to Embodiment 2, except that: (1) projection electrodes 16 are provided instead of the projection electrodes 5 that are the solder balls; (2) instead of the cured liquid resin 15, an anisotropic conductive adhesive agent (ACA) 21 is provided in the void between the internal semiconductor apparatus package 1 and the circuit substrate 11; (3) instead of the liquid resin 15, the adhesive sheet 9 is provided as the adhesive material for adhering the internal semiconductor apparatus package 1 and the semiconductor apparatus 2 together.

The present embodiment uses the LGA package as the internal semiconductor apparatus package 1, and the internal semiconductor apparatus package 1 does not have the projection electrodes 5 that are solder balls. Note that any LGA package including at least one semiconductor apparatus can be used as the semiconductor apparatus package 1 constituting the stack type semiconductor apparatus package of the present embodiment. Examples of the semiconductor apparatus package 1 that can be used to constitute the stack type semiconductor apparatus package of the present invention include: (i) an internal semiconductor apparatus package obtained by omitting the projection electrodes 5 from the internal semiconductor apparatus package 1 shown in FIG. 6; (ii) the aforementioned internal semiconductor apparatus package 1A shown in FIG. 11; and (iii) an internal semiconductor apparatus package obtained by omitting the projection electrodes 5 from each of the aforementioned internal semiconductor apparatuses 1B to 1E respectively shown in FIG. 12 to FIG. 15. For each of these internal semiconductor apparatus packages 1 and 1A to 1E, a general package can be used. A specific example of such a general package is the general internal semiconductor apparatus package 1 individually provided on the mount substrate 19 in such a manner shown in FIG. 10.

Explained next is an example of a method for manufacturing the stack type semiconductor apparatus package shown in FIG. 3, with reference to FIG. 21 to FIG. 26. Each of FIG. 21 to FIG. 25 is a cross sectional view illustrating the structure of the stack type semiconductor apparatus package according to the present embodiment, in each manufacturing step. FIG. 26 is a cross sectional view illustrating one example of the product stack type semiconductor apparatus package according to the present embodiment.

Firstly carried out is preparation of the internal semiconductor apparatus package 1 having no projection electrode 5. Such an internal semiconductor apparatus package 1 having no projection electrodes 5 can be manufactured in accordance with various well-known methods described in the patent document 1 and the like. Further, the circuit substrate 11 is prepared on which the first connecting pads 6, the second connecting pads 7, and the insulating films 121 and 122 are provided. The circuit substrate 11 can be manufactured in accordance with various well-known methods described in the aforementioned patent document 1 and the like.

Figure 21:
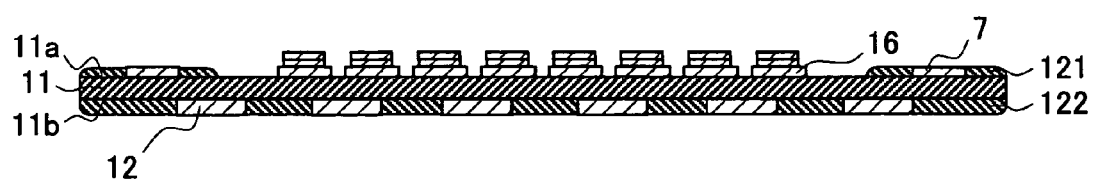
FIG. 21 is a cross sectional view illustrating the structure of the stack type semiconductor apparatus package according to Embodiment 3 of the present invention in a manufacturing step.

Next, as shown in FIG. 21, the projection electrodes 16 are provided on the first connecting pads 6 of the circuit substrate 11, respectively. The following methods (1) to (3) can be adopted as a method for forming the projection electrodes 16: (1) when forming the circuit substrate 11, etching is carried out with respect to a metal layer so as to form the first connecting pads 6 each projecting higher than the insulating film 121, and the respective projecting portions of the first connecting pads 6 are used as the projection electrodes 16; (2) when forming the circuit substrate 11, plating is carried out with respect to the first connecting pads 6 so as to respectively form, on the first connecting pads 6, plating layers projecting higher than the insulating film 121, and the planting layers thus formed are used as the projection electrodes 16; (3) after forming the circuit substrate 11, a stud bump made of a gold (Au) wire is provided as each of the projection electrodes 16.

Figure 22:
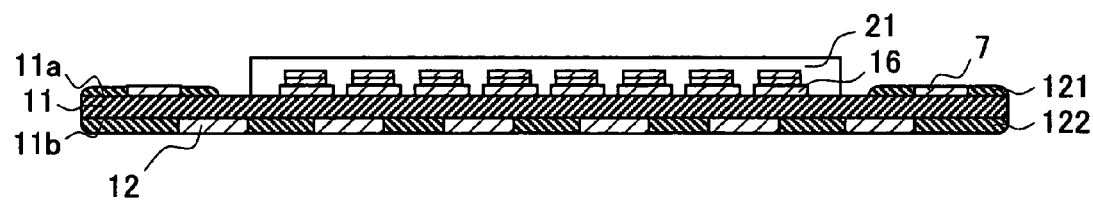
FIG. 22 is a cross sectional view illustrating the structure of the stack type semiconductor apparatus package according to Embodiment 3 of the present invention in another manufacturing step.

Next, as shown in FIG. 22, the anisotropic conductive adhesive agent 21 is provided, as the third resin, on the face 11a of the circuit substrate 11. Examples of the anisotropic conductive adhesive agent 21 include an anisotropic conductive film (ACF), an anisotropic conductive paste (ACP), and the like. The anisotropic conductive adhesive agent 21 can be provided by adhering the anisotropic conductive film on the face 11a of the circuit substrate 11, or by applying the anisotropic conductive paste thereto, or the like.

Figure 23:
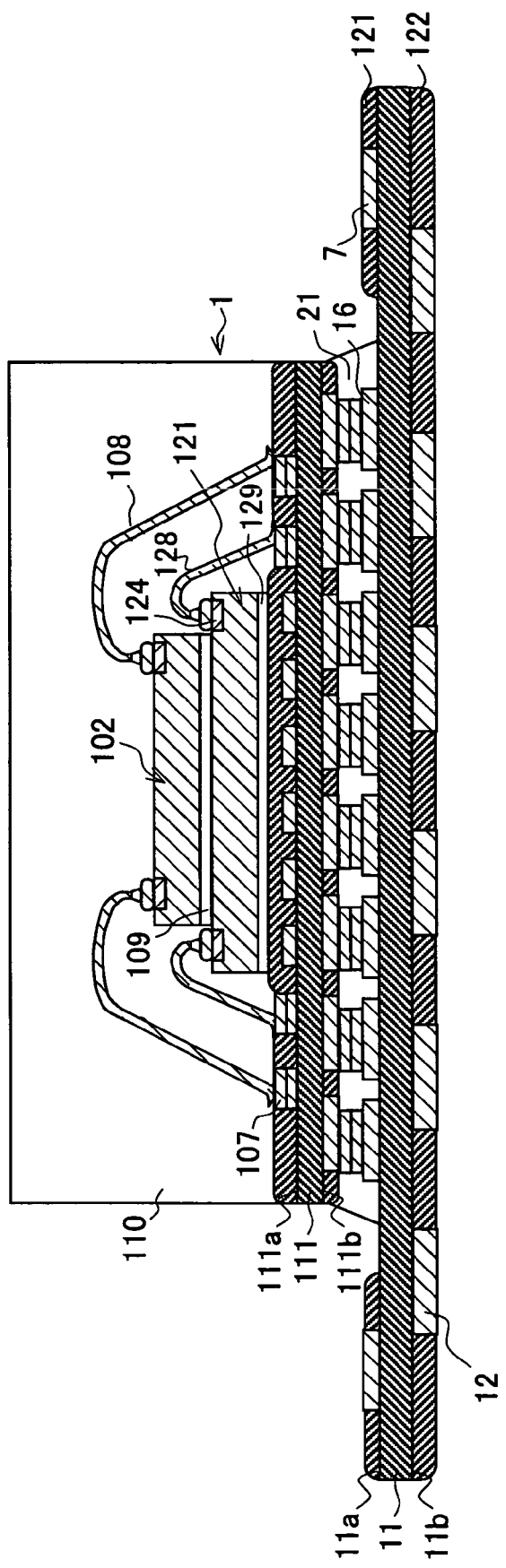
FIG. 23 is a cross sectional view illustrating the structure of the stack type semiconductor apparatus package according to Embodiment 3 of the present invention in still another manufacturing step.

Next, see FIG. 23. Each of the projection electrodes 16 formed on the first connecting pads 6 provided on the circuit substrate 11 is aligned with each of the external input/output terminals 3 of the internal semiconductor apparatus package 1D having no projection electrodes 5, and then the projection electrode 16 and the external input/output terminal 3 are connected with each other by way of the anisotropic conductive adhesive agent 21. The following methods (1), (2), and the like, can be adopted as a method for attaining the connection: (1) a flip chip bonder is used such that the use of heat and/or load allows the connection between the projection electrode 16 and the external input/output terminal 3 with the anisotropic conductive adhesive agent 21 therebetween; (2) a supersonic wave flip chip bonder is used such that the projection electrode 16 and the external input/output terminal 3 are connected (metal-connected) with each other by using (i) only a supersonic wave, or (ii) a combination of a supersonic wave and heat and/or load. In the case where the methods (1) and (2) are adopted, an insulating material such as a non conductive film (NCF) or a non conductive paste (NCP) can be used as the third resin instead of the anisotropic conductive adhesive agent 21.

Figure 24:
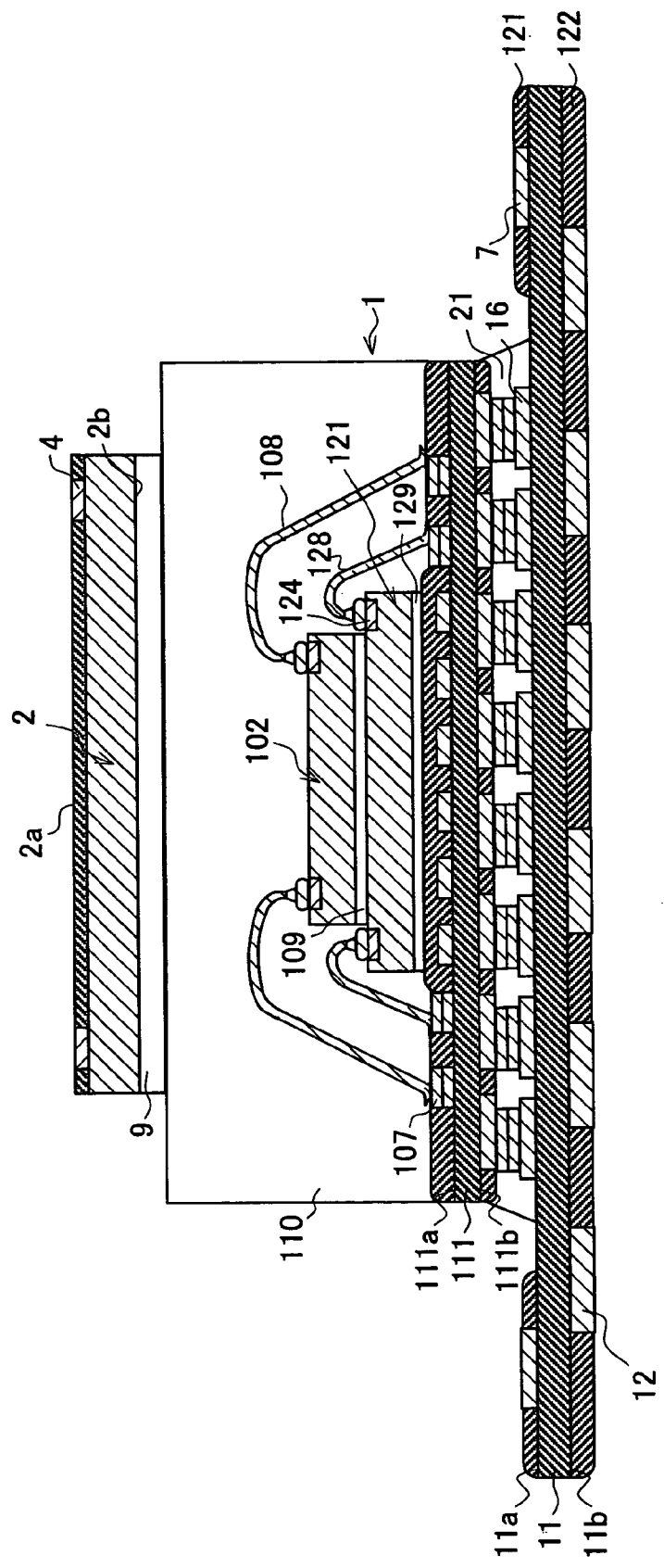
FIG. 24 is a cross sectional view illustrating the structure of the stack type semiconductor apparatus package according to Embodiment 3 of the present invention in yet another manufacturing step.

Next, as shown in FIG. 24, the semiconductor apparatus 2 is adhered to the upper face (the face reverse to the face on which the external input/output terminals 3 are provided) of the internal semiconductor apparatus package 1D, by using the adhesive material. In FIG. 24, the adhering is carried out in the following manner. That is, the adhesive sheet (adhesive material) 9 is provided in advance on the rear face (the face reverse to the face on which the electrodes 4 are provided) of the semiconductor apparatus 2, and then the semiconductor apparatus 2 is mounted on the upper face of the internal semiconductor apparatus package 1D, and heat is applied thereto so as to adhere the semiconductor apparatus 2 to the upper face of the internal semiconductor apparatus package 1D. However, the adhering method using the adhesive material is not limited to the above method, and the adhering may be carried out as follows. That is, the adhesive sheet 9 is adhered to the upper face (the face reverse to the face on which the external input/output terminals 3 are provided), and then the semiconductor apparatus 2 is mounted on the adhesive sheet 9, and then heat is applied thereto so as to adhere the semiconductor apparatus 2 to the upper face of the internal semiconductor apparatus package 1D. Moreover, instead of the adhesive sheet 9, the liquid adhesive resin (liquid adhesive material, adhesive material) 14 may be used to adhere the semiconductor apparatus 2 to the upper face of the internal semiconductor apparatus package 1, as is the case with the stack type semiconductor apparatus package shown in FIG. 2.

Figure 25:
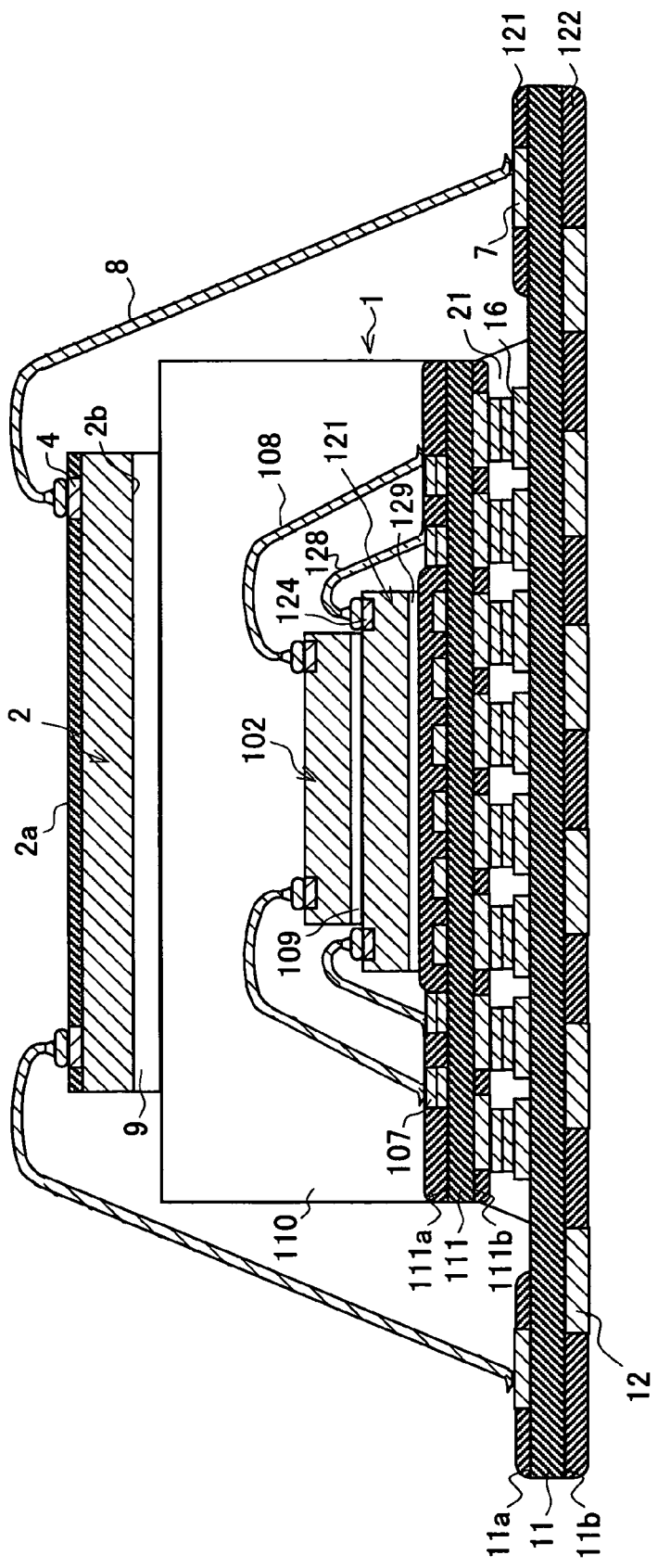
FIG. 25 is a cross sectional view illustrating the structure of the stack type semiconductor apparatus package according to Embodiment 3 of the present invention in still another manufacturing step.
Figure 26:
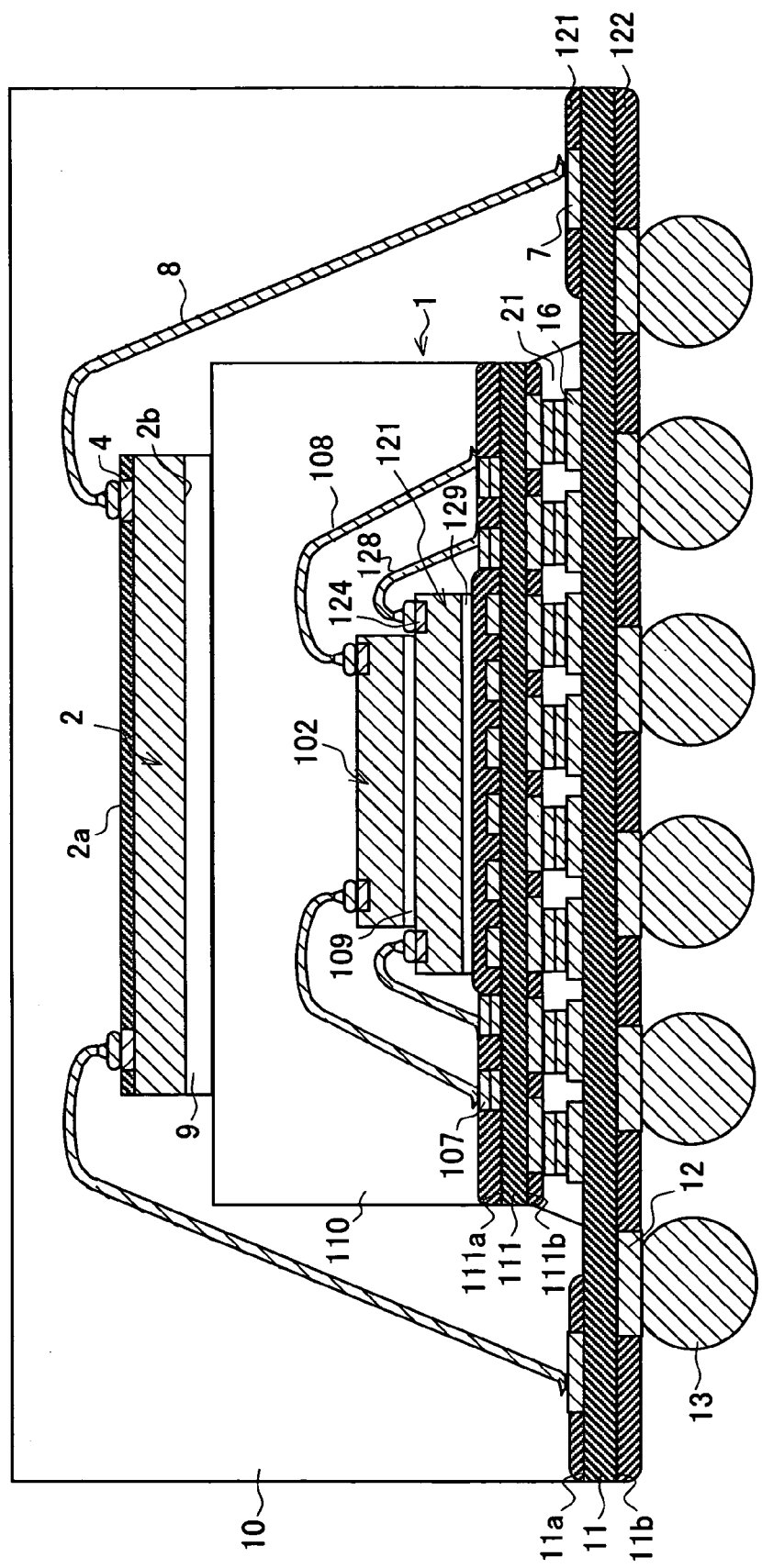
FIG. 26 is a cross sectional view illustrating the structure of the stack type semiconductor apparatus according to Embodiment 3 of the present invention.
Figure 27:
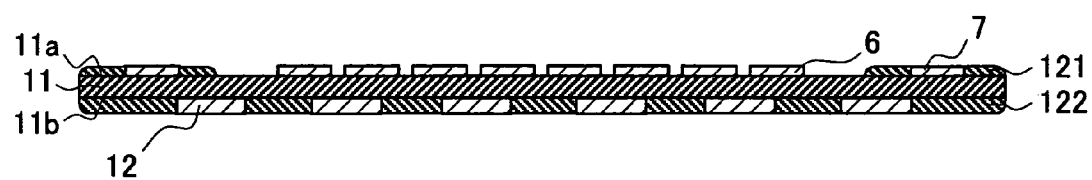
FIG. 27 is a cross sectional view illustrating the structure of the stack type semiconductor apparatus package according to Embodiment 4 of the present invention in a manufacturing step.

Next, as shown in FIG. 25, the thin metal wires 8 are used to electrically connect (i) the electrodes 4 of the semiconductor apparatus 2 thus mounted, to (ii) the second connecting pads 7 provided on the circuit substrate 11, respectively.

Thereafter, as shown in FIG. 26, the heat-curing sealing resin 10 is used to seal the entire components installed in the stack type semiconductor apparatus package. The entire components include the internal semiconductor apparatus package 1D, the semiconductor apparatus 2, and the thin metal wires 8. The sealing may be carried out in accordance with the transfer mold method using a resin pellet, or with a method of potting a liquid resin.

Finally, as shown in FIG. 26, the solder balls serving as the projection electrodes 13 are respectively provided on (i) the external input/output terminals 12 electrically connected to the first connecting pads 6, and (ii) the external input/output terminals 12 electrically connected to the second connecting pads 7. Note that this process is carried out so as to allow the stack type semiconductor apparatus package to be a BGA package. For this reason, in cases where the stack type semiconductor apparatus package is to be a LGA package, the process is not required.

Embodiment 4

The following description deals with (i) a stack type semiconductor apparatus package according to yet another embodiment of the present invention, and (ii) a manufacturing method thereof with reference to FIG. 10 to FIG. 15, and FIG. 27 to FIG. 32. For ease of explanation, materials having the equivalent functions as those shown in the drawings pertaining to any of the foregoing Embodiments 1 to 3 will be given the same reference symbols, and explanation thereof will be omitted here.

Figure 32:
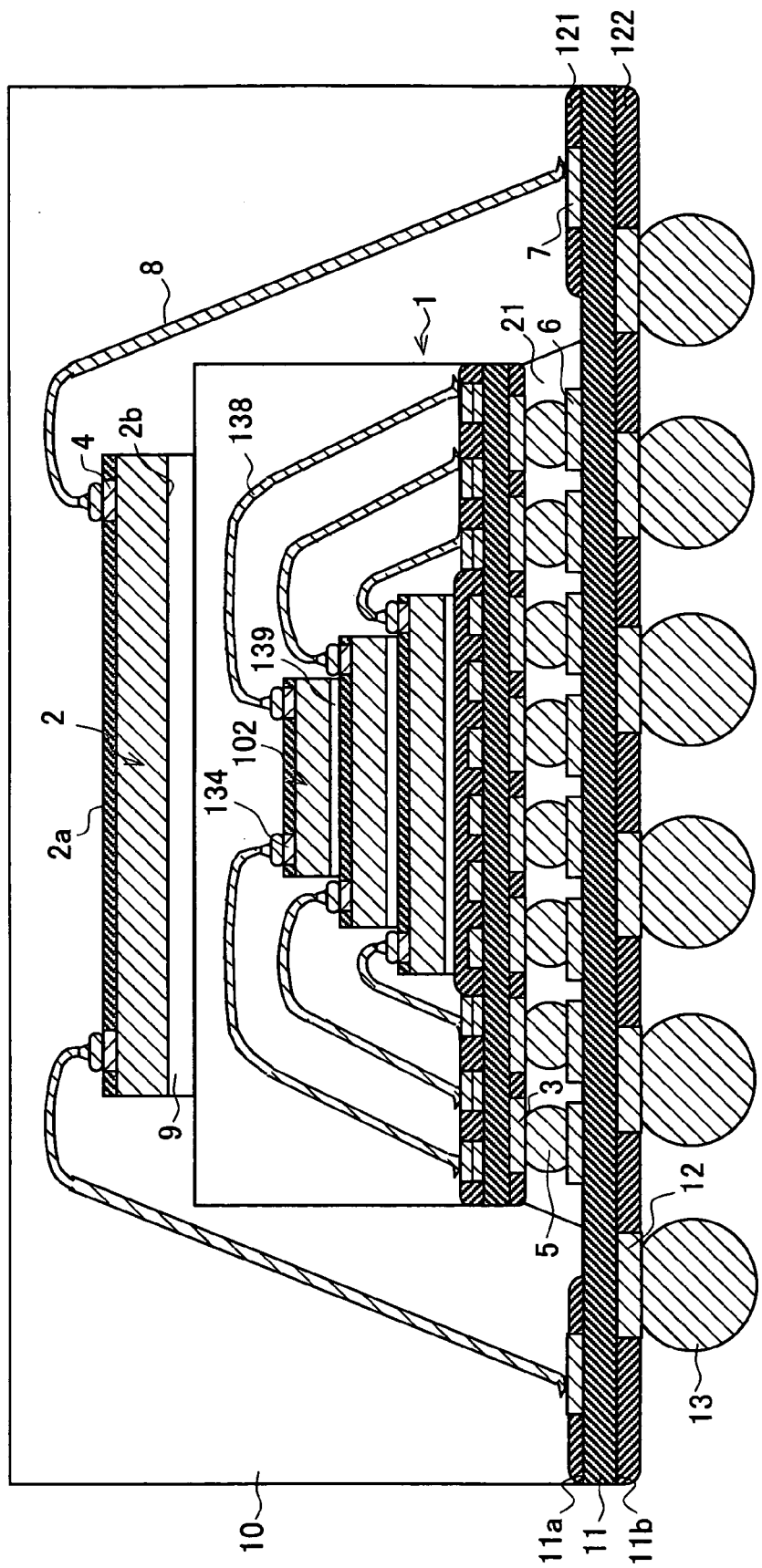
FIG. 32 is a cross sectional view illustrating the structure of the stack type semiconductor apparatus according to Embodiment 4 of the present invention.

FIG. 32 is a cross sectional view illustrating the stack type semiconductor apparatus package according to the present embodiment. As shown in FIG. 32, the stack type semiconductor apparatus package according to the present embodiment have the same structure as the structure of the stack type semiconductor apparatus package according to Embodiment 2, except that: (1) the internal semiconductor apparatus package 1E is provided instead of the internal semiconductor apparatus package 1D; and (2) instead of the liquid resin 15, the anisotropic conductive adhesive agent 21 (ACA) is provided in the void between the internal semiconductor apparatus package 1 and the circuit substrate 11.

The present embodiment uses a CSP or BGA package as the internal semiconductor apparatus package 1. The internal semiconductor apparatus package 1 is, e.g., a complex memory package made up of three memories: (i) a SRAM (Static Random Access Memory), (ii) a pseudo SRAM (Pseudo Static RAM), and (iii) a flash memory. On the other hand, the semiconductor apparatus 2 is an ASIC (Application Specific Integrated Circuit).

Figure 4:
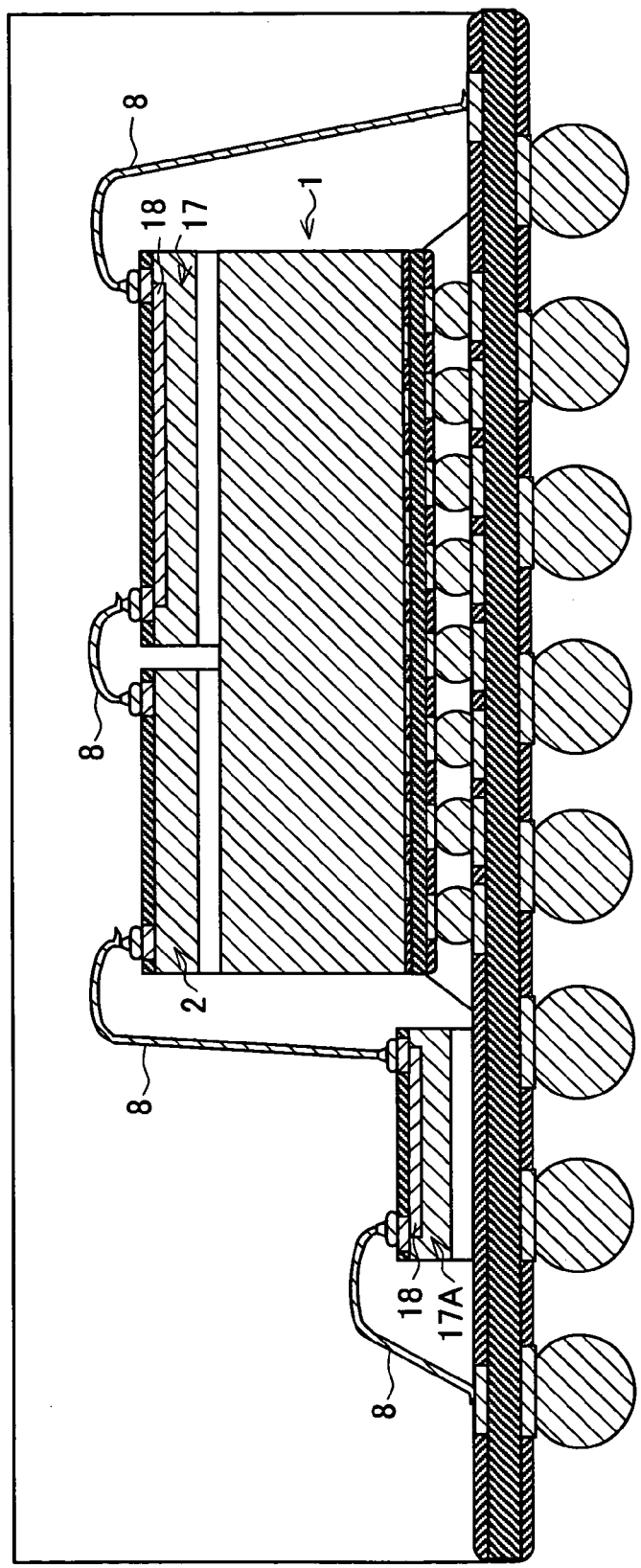
FIG. 4 is a cross sectional view illustrating a structure of a stack type semiconductor apparatus according to Embodiment 5 of the present invention.
Figure 15:
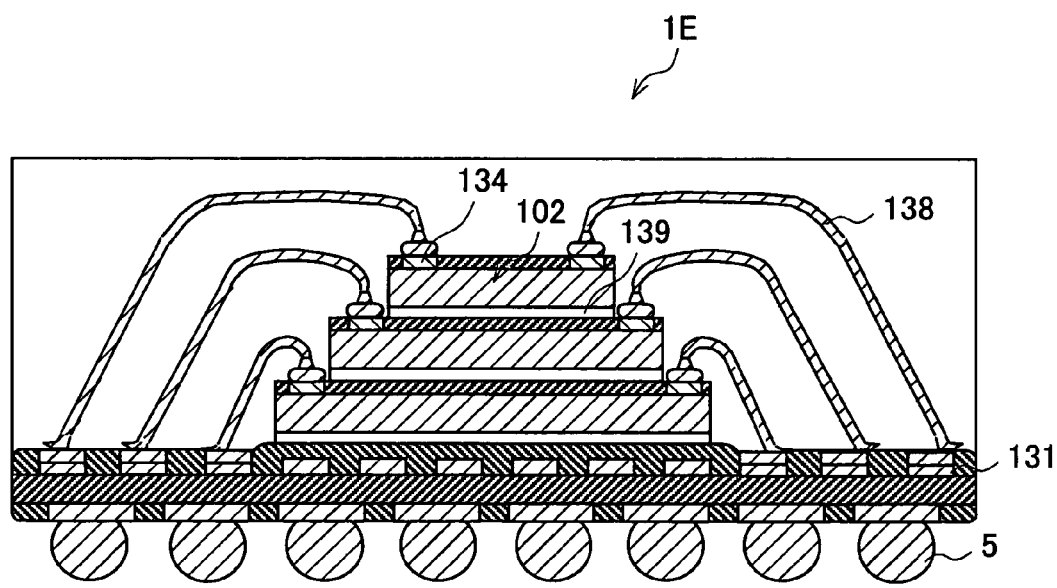
FIG. 15 is a cross sectional view illustrating a structure of an internal semiconductor apparatus package according to one embodiment of the present invention.

Any CSP package or any BGA package, each of which includes at least one semiconductor apparatus, can be used as the semiconductor apparatus package 1 constituting the stack type semiconductor apparatus package of the present embodiment. The internal semiconductor apparatus package 1 shown in FIG. 1, and the internal semiconductor apparatus packages 1A to 1E respectively shown in FIG. 11 to FIG. 15 are specific examples of the semiconductor apparatus package that can be used to constitute the stack type semiconductor apparatus package of the present embodiment. For each of the internal semiconductor apparatus packages 1 and 1A to 1E, a general package can be used. A specific example of such a general package is the general internal semiconductor apparatus package 1 individually provided on the mount substrate 19 in such a manner shown in FIG. 10. FIG. 4 illustrates a case where the internal semiconductor apparatus package 1E shown in FIG. 15 is used as the internal semiconductor apparatus package 1.

Explained next is an example of a method for manufacturing the stack type semiconductor apparatus package shown in FIG. 32, with reference to FIG. 27 to FIG. 32. Each of FIG. 27 to FIG. 31 is a cross sectional view illustrating the structure of the stack type semiconductor apparatus package according to the present embodiment in each manufacturing step.

Firstly, the internal semiconductor apparatus package 1 is prepared. The internal semiconductor apparatus package 1 can be manufactured in accordance with various well-known methods described in the patent document 1 and the like.

Further, there is prepared the circuit substrate 11, on which the first connecting pads 6, the second connecting pads 7, and the insulating films 121 and 122 are provided. The circuit substrate 11 can be manufactured in accordance with various well-known methods described in the aforementioned patent document 1 and the like.

Figure 28:
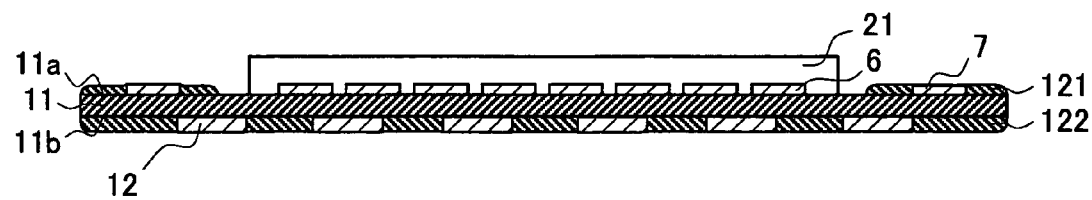
FIG. 28 is a cross sectional view illustrating the structure of the stack type semiconductor apparatus package according to Embodiment 4 of the present invention in another manufacturing step.

Next, as shown in FIG. 28, the anisotropic conductive adhesive agent 21 serving as the third resin is provided on the face 11a of the circuit substrate 11. Examples of the anisotropic conductive adhesive agent 21 include the anisotropic conductive film (ACF) and the anisotropic conductive paste (ACP). The anisotropic conductive adhesive agent 21 can be provided by adhering the anisotropic conductive film to the face 11a of the circuit substrate 11, or by applying the anisotropic conductive paste thereto, or the like.

Figure 29:
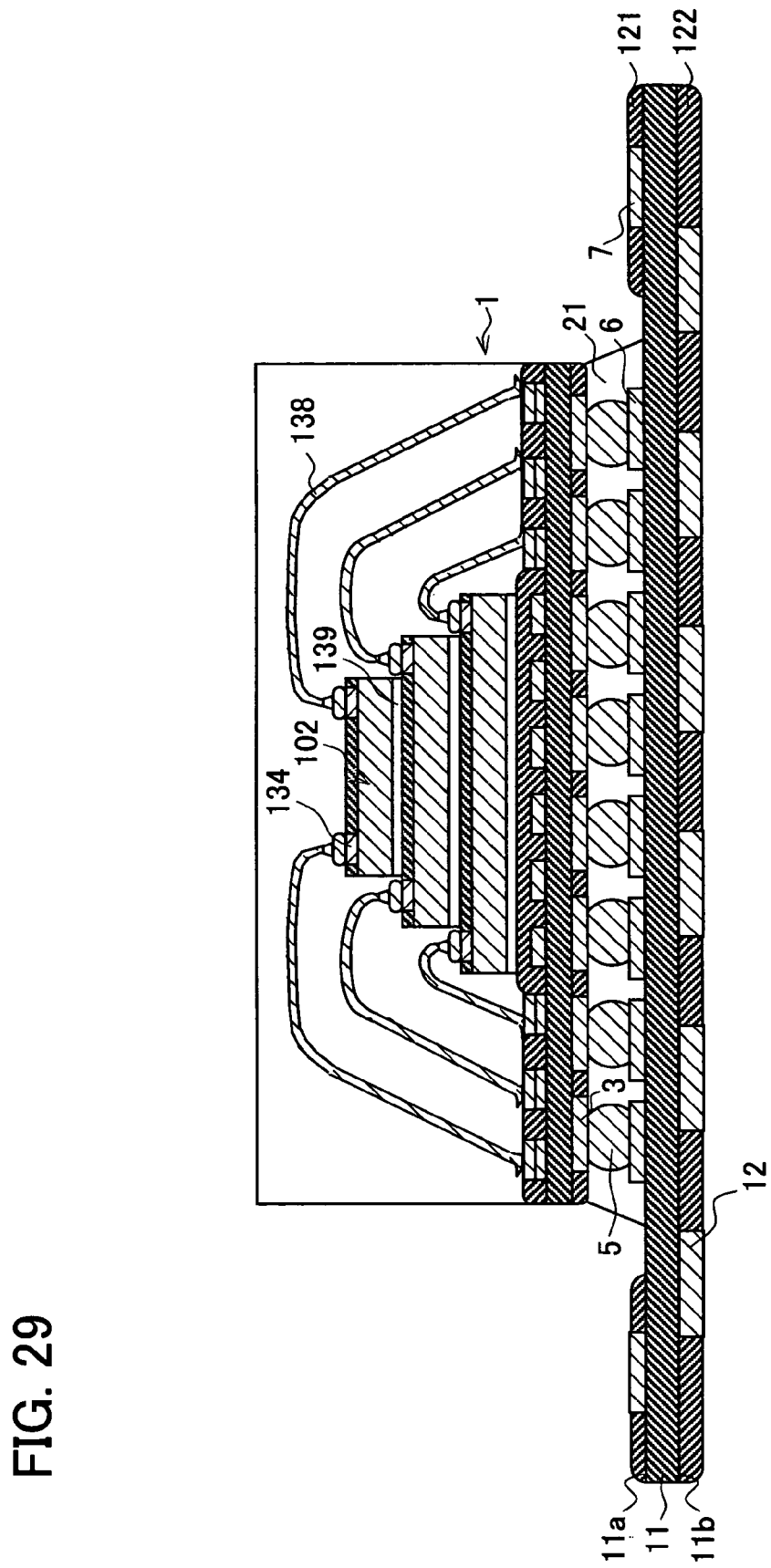
FIG. 29 is a cross sectional view illustrating the structure of the stack type semiconductor apparatus package according to Embodiment 4 of the present invention in still another manufacturing step.

Next, see FIG. 29. Each of the projection electrodes 5 (solder balls) formed on the first connecting pads 6 provided on the circuit substrate 11 is aligned with each of the external input/output terminals 3 of the internal semiconductor apparatus package 1, and then the projection electrode 5 and the external input/output terminal 3 are connected with each other by way of the anisotropic conductive adhesive agent 21. The following methods (1), (2), and the like, can be adopted as a method for attaining the connection between the projection electrode 5 and the connecting pad 6: (1) a flip chip bonder is used such that the use of heat and/or load allows the connection between the projection electrode 5 and the connecting pad 6 with the anisotropic conductive adhesive agent 21 therebetween; (2) a supersonic wave flip chip bonder is used such that the projection electrode 5 and the connecting pad 6 are connected (metal-connected) with each other by using (i) only a supersonic wave, or (ii) a combination of a supersonic wave and heat and/or load. In the case where the methods (1) or (2) are adopted, an insulating material such as a non conductive film (NCF) or a non conductive paste (NCP) can be used as the third resin instead of the anisotropic conductive adhesive agent 21.

Figure 30:
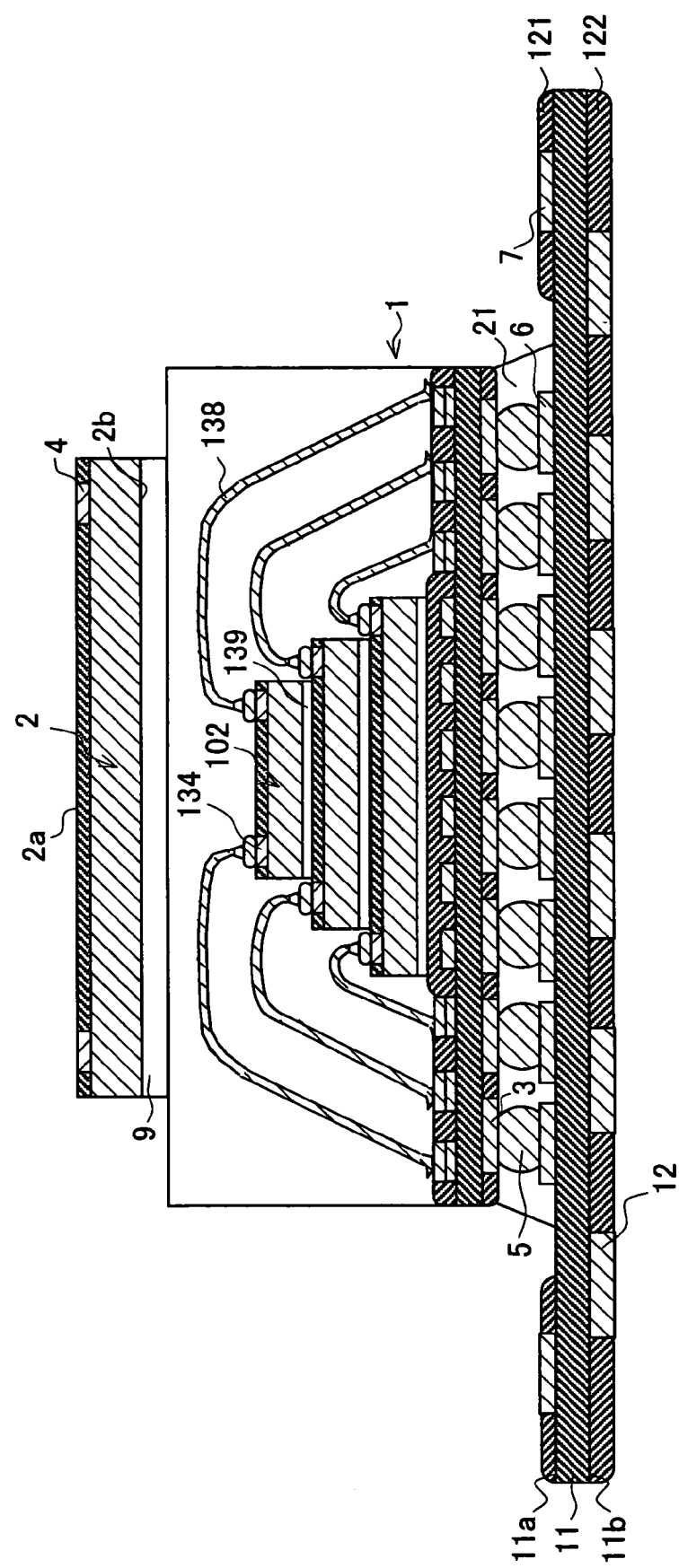
FIG. 30 is a cross sectional view illustrating the structure of the stack type semiconductor apparatus package according to Embodiment 4 of the present invention in yet another manufacturing step.

Next, as shown in FIG. 30, the semiconductor apparatus 2 is adhered to the upper face (the face reverse to the face on which the external input/output terminals 3 are provided) of the internal semiconductor apparatus package 1, by using the adhesive material. In FIG. 30, the adhering is carried out in the following manner. That is, the adhesive sheet (adhesive material) 9 is provided in advance on the rear face (the face reverse to the face on which the electrodes 4 are provided) of the semiconductor apparatus 2, and then the semiconductor apparatus 2 is mounted on the upper face of the internal semiconductor apparatus package 1, and heat is applied thereto so as to adhere the semiconductor apparatus 2 to the upper face of the internal semiconductor apparatus package 1. However, the adhering method using the adhesive material is not limited to the above method, and the adhering may be carried out as follows. That is, the adhesive sheet 9 is adhered to the upper face (the face reverse to the face on which the external input/output terminals 3 are provided), and then the semiconductor apparatus 2 is mounted on the adhesive sheet 9, and then heat is applied thereto so as to adhere the semiconductor apparatus 2 to the upper face of the internal semiconductor apparatus package 1. Moreover, instead of the adhesive sheet 9, the liquid adhesive resin (liquid adhesive material, adhesive material) 14 may be used to adhere the semiconductor apparatus 2 to the upper face of the internal semiconductor apparatus package 1, as is the case with the stack type semiconductor apparatus package shown in FIG. 2.

Figure 31:
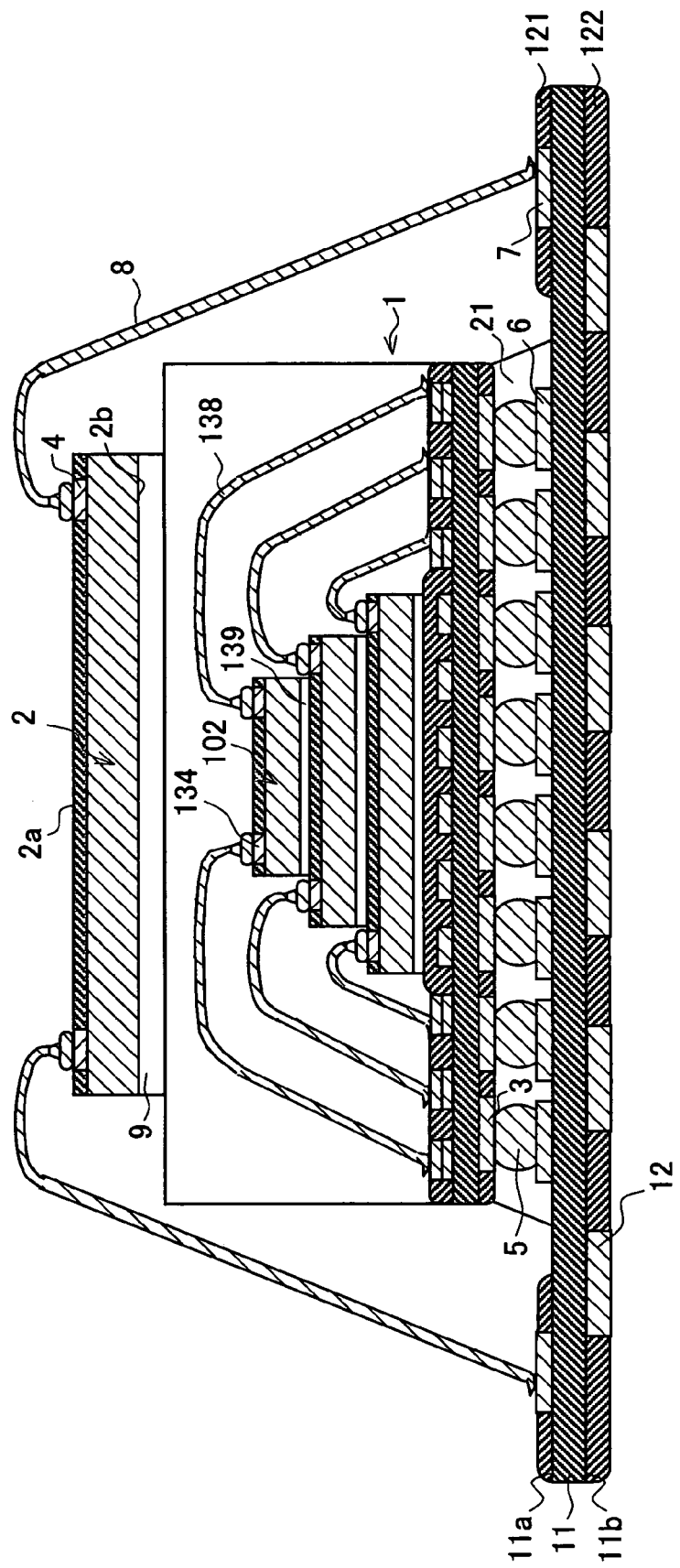
FIG. 31 is a cross sectional view illustrating the structure of the stack type semiconductor apparatus package according to Embodiment 4 of the present invention in still another manufacturing step.

Next, as shown in FIG. 31, the thin metal wires 8 are used to electrically connect (i) the electrodes 4 of the semiconductor apparatus 2 thus mounted, to (ii) the second connecting pads 7 provided on the circuit substrate 11, respectively.

Thereafter, as shown in FIG. 32, the heat-curing sealing resin 10 is used to seal the entire components installed in the stack type semiconductor apparatus package. The entire components include the internal semiconductor apparatus package 1, the semiconductor apparatus 2, and the thin metal wires 8. The sealing may be carried out in accordance with the transfer mold method using a resin pellet, or with a method of potting a liquid resin.

Finally, as shown in FIG. 32, the solder balls serving as the projection electrodes 13 are respectively provided on (i) the external input/output terminals 12 electrically connected to the first connecting pads 6, and (ii) the external input/output terminals 12 electrically connected to the second connecting pads 7. Note that this process is carried out so as to allow the stack type semiconductor apparatus package to be a BGA package. For this reason, in cases where the stack type semiconductor apparatus package is to be a LGA package, the process is not required.

Embodiment 5

Figure 5:
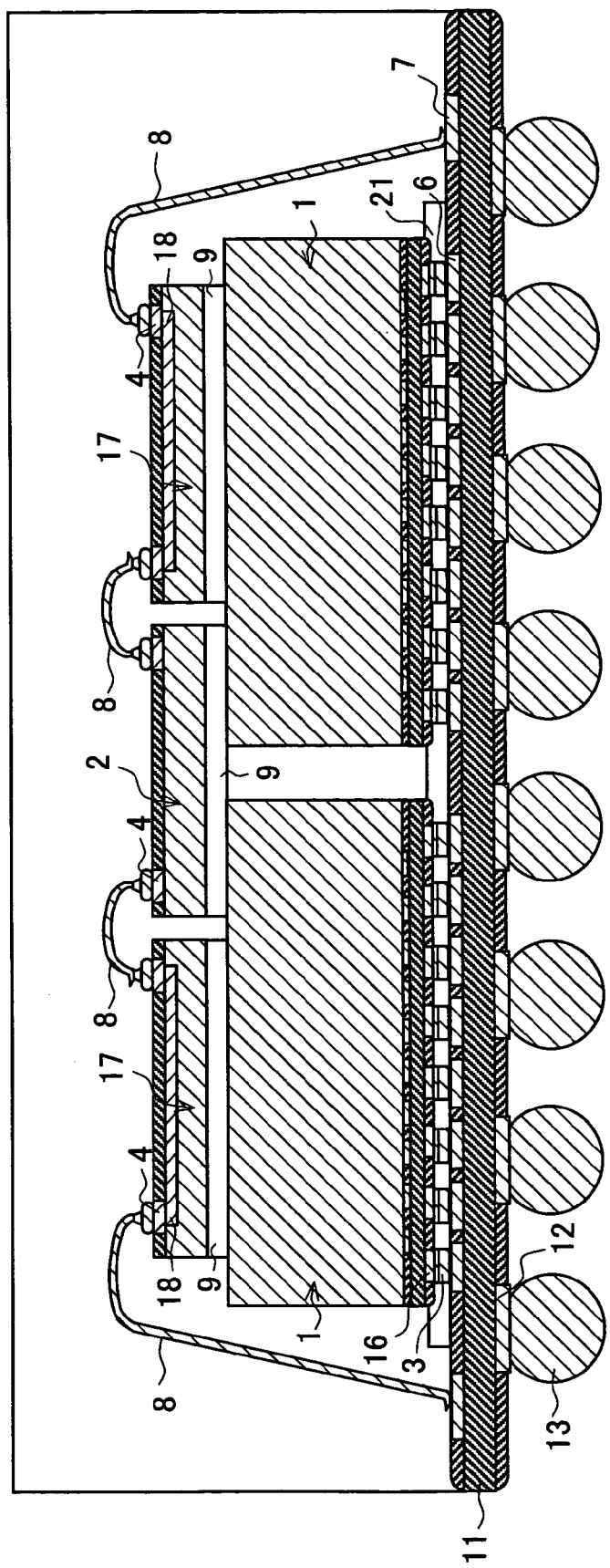
FIG. 5 is a cross sectional view illustrating a structure of another stack type semiconductor apparatus according to Embodiment 5 of the present invention.

The following description deals with (i) a stack type semiconductor apparatus package according to still another embodiment of the present invention, and (ii) a manufacturing method thereof with reference to FIG. 4 and FIG. 5. For ease of explanation, materials having the equivalent functions as those shown in the drawings pertaining to any of the foregoing Embodiments 1 to 4 will be given the same reference symbols, and explanation thereof will be omitted here.

In cases where the internal semiconductor apparatus package 1 is larger in size than the semiconductor apparatus 2 in the stack type semiconductor apparatus package according to Embodiment 2, the larger a difference in the size therebetween is, the longer each of the thin metal wires 8 is. For this reason, when molding the sealing resin 10 in accordance with the transfer molding method or the like, the metal wire 8 is possibly swept away, with the result that short circuit possibly occurs. Particularly in cases where the semiconductor apparatus 2 is the logic type, the semiconductor apparatus 2 has a narrow pitch and a lot of pins. Accordingly, the short circuit is more likely to occur.

Moreover, the thin metal wire 8 is also long in cases where the stack type semiconductor apparatus package according to Embodiment 2 is arranged such that the semiconductor apparatus 2 is provided on and over a plurality of (e.g., two) internal semiconductor apparatus packages 1. For this reason, when molding the sealing resin 10 in accordance with the transfer molding method or the like, the metal wire 8 is possibly swept away, with the result that short circuit possibly occurs.

For prevention of this, the present embodiment uses each of dummy chips 17 as a member via which the thin metal wire 8 is connected to the semiconductor apparatus 2. Specifically, as shown in FIG. 4, the dummy chip 17 is provided on the upper face of the internal semiconductor apparatus package 1, and on the circuit substrate 11, and the dummy chip 17 has a wire 18 via which the thin metal wire 8 is connected to the semiconductor apparatus 2.

FIG. 4 and FIG. 5 respectively illustrate structures of the stack type semiconductor apparatus packages according to the present embodiment. The stack type semiconductor apparatus package that is shown in FIG. 4 and that is according to the present embodiment is obtained by providing (i) a dummy chip 17 on the upper face (face facing the semiconductor apparatus 2) of the internal semiconductor apparatus package 1D of the stack type semiconductor apparatus package according to Embodiment 2; and (ii) a dummy chip 17A on the face (first face) 11a of the circuit substrate 11 thereof. The dummy chip 17 serves as a first thin metal wire connecting member, and the dummy chip 17A serves as a second thin metal wire connecting member.

Further, the stack type semiconductor apparatus package that is shown in FIG. 5 and that is according to the present embodiment is obtained by modifying the stack type semiconductor apparatus package according to Embodiment 3 such that: (1) two internal semiconductor apparatus packages 1 are provided; (2) the semiconductor apparatus 2 is provided on and over the respective upper faces (faces facing the semiconductor apparatus 2) of the internal semiconductor packages 1; (3) a dummy chip 17 serving as a first thin metal wire connecting member is provided on the upper face (face facing the semiconductor apparatus 2) of one of the internal semiconductor apparatus packages 1; and (4) a dummy chip 17 serving as the first thin metal wire connecting member is provided on the upper face (face facing the semiconductor apparatus 2) of the other internal semiconductor apparatus package 1. Each of the dummy chips 17 and 17A includes the wire (the first wire, the second wire) 18 connected, via the thin metal wire 8, to (i) each of the electrodes 4 of the semiconductor apparatus 2, and (ii) each of the second connecting pads 7 thereof.

The stack type semiconductor apparatus package shown in FIG. 4 makes it possible to shorten the part (the thin metal wire 8) that is possibly to be swept away by the sealing resin 10 when molding the sealing resin 10 in accordance with the transfer mold method or the like. This makes it possible to prevent the thin metal wire 8 from being swept away upon molding the sealing resin 10 in accordance with the transfer mold method or the like. Accordingly, the short circuit due to the sweep-away of the thin metal wire 8 can be prevented.

Likewise, the stack type semiconductor apparatus package shown in FIG. 5, i.e., the stack type semiconductor apparatus package, in which the semiconductor apparatus 2 is provided on and over the plural (two in FIG. 5) internal semiconductor apparatus packages 1, makes it possible to shorten the part (the thin metal wire 8) that is possibly to be swept away by the sealing resin 10 when molding the sealing resin 10 in accordance with the transfer mold method or the like. This makes it possible to prevent the thin metal wire 8 from being swept away upon molding the sealing resin 10 in accordance with the transfer mold method or the like. Accordingly, the short circuit due to the sweep-away of the thin metal wire 8 can be prevented.

Note that, in the example above, the dummy chips 17 and 17A each made from a semiconductor are respectively used as the first thin metal wire connecting member and the second thin metal wire connecting member (member through which the thin metal wire achieves the connection); however, the present invention is not limited to this. A metal frame, a dummy circuit substrate, or the like can be used as the thin metal wire connecting member.

Note also that the stack type semiconductor apparatus package shown in FIG. 4 can be manufactured in accordance with the following manufacturing method. The manufacturing method includes: (i) the steps that the manufacturing method of Embodiment 2 includes; (ii) a step of adhering the dummy chip 17 having the wire 18 to the face of the internal semiconductor apparatus package 1, which face is toward the semiconductor apparatus 2; and (iii) a step of adhering the dummy chip 17A having the wire 18 to the face (first face) 11a of the circuit substrate 11; in the step of carrying out the connecting with the use of the thin metal wires 8. The wires 18 connect the electrodes 4 of the semiconductor apparatus 2, via the thin metal wires 8, to the second connecting pads 7 provided on the circuit substrate 11, respectively.

Note also that the stack type semiconductor apparatus package shown in FIG. 5 uses the two internal semiconductor apparatus packages 1, and can be manufactured in accordance with the following manufacturing method. The manufacturing method includes: (i) the steps that the manufacturing method of Embodiment 3 includes; and (ii) a step of adhering the dummy chips 17 respectively having the wires 18, to the respective faces of the internal semiconductor apparatus packages 1, which faces are toward the semiconductor apparatus 2; in the step of carrying out the connecting with the use of the thin metal wires 8. The wires 18 connect the electrodes 4 of the semiconductor apparatus 2, via the thin metal wires 8, to the second connecting pads 7 provided on the circuit substrate 11, respectively.

Embodiment 6

Figure 33:
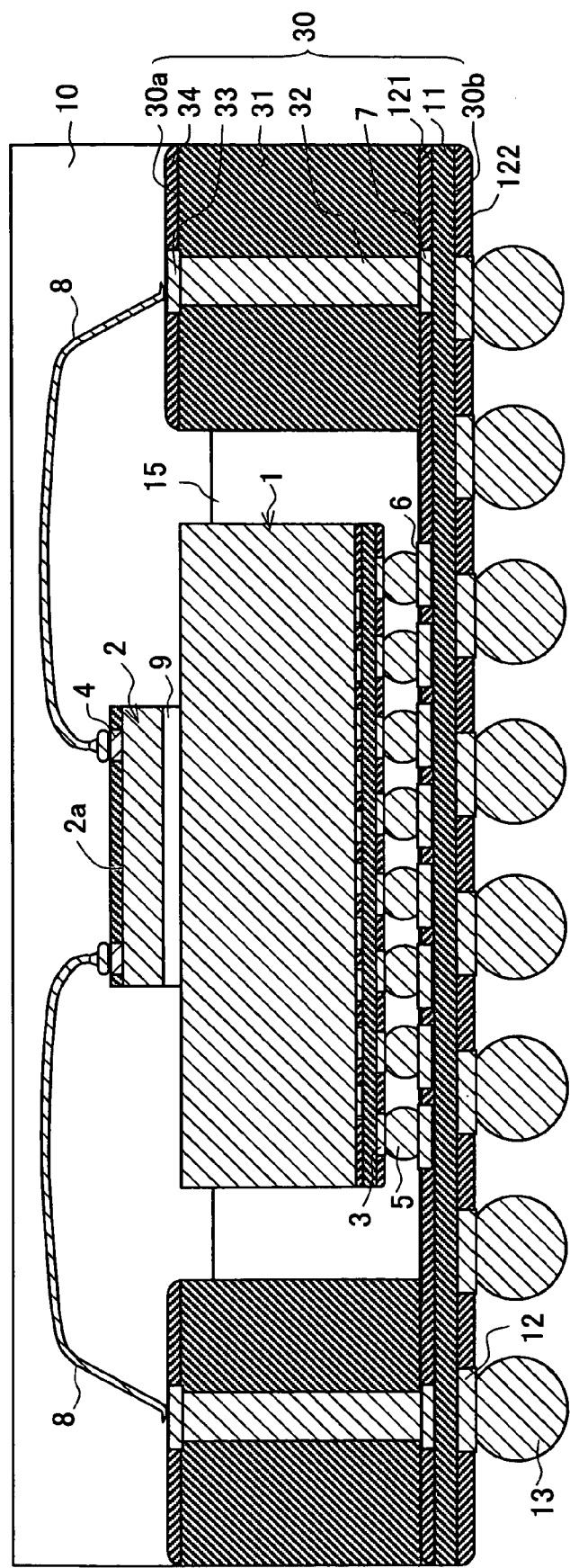
FIG. 33 is a cross sectional view illustrating a structure of a stack type semiconductor apparatus according to Embodiment 6 of the present invention.
Figure 34:
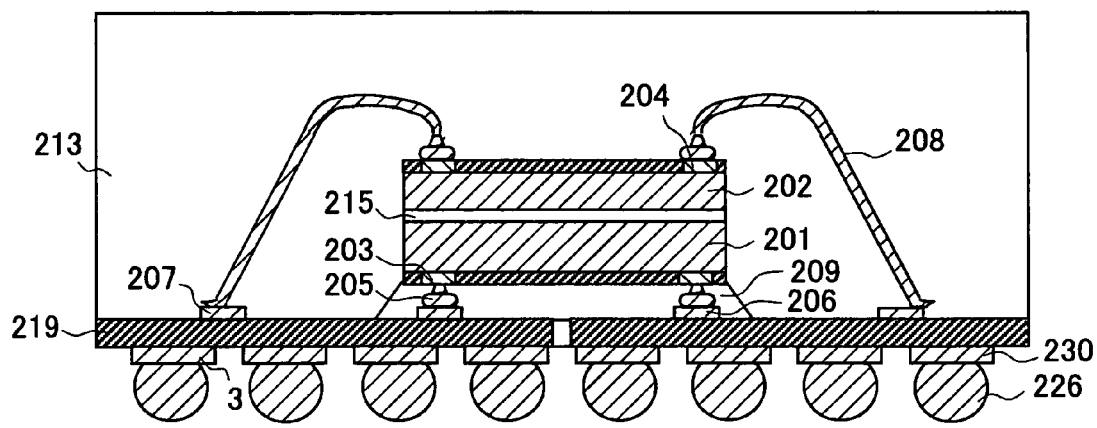
FIG. 34 is a cross sectional view illustrating a structure of a conventional stack type semiconductor apparatus package.

The following description deals with (i) a stack type semiconductor apparatus package according to yet another embodiment of the present invention, and (ii) a manufacturing method thereof with reference to FIG. 33. For ease of explanation, materials having the equivalent functions as those shown in the drawings pertaining to any of the foregoing Embodiments 1 to 5 will be given the same reference symbols, and explanation thereof will be omitted here.

The present embodiment is different from Embodiment 5, but is also an embodiment for preventing the short circuit due to the sweep-away of the thin metal wire 8, which sweep-away occurs upon molding the sealing resin 10 in accordance with the transfer mold method or the like.

FIG. 33 is a cross sectional view illustrating the stack type semiconductor apparatus package according to the present embodiment. As shown in FIG. 33, the stack type semiconductor apparatus package according to the present embodiment have the same structure as the structure of the stack type semiconductor apparatus package according to Embodiment 2, except that: (1) a circuit substrate 30 is provided instead of the circuit substrate 11; (2) instead of the connecting pads 7, connecting pads 33 are provided as the second connecting pads connected to the electrodes 4 via the metal wires 8; and (3) instead of the liquid resin 15, the adhesive sheet 9 is provided as the adhesive material for adhering the internal semiconductor apparatus package 1 and the semiconductor apparatus 2 together.

The circuit substrate 30 has a face (first face) 30a associated with the semiconductor apparatus 2. In a center region of the face 30a, a recess portion is provided. More specifically, the circuit substrate 30 is manufactured in the following manner. That is, an insulating layer 31 thicker than the internal semiconductor apparatus package 1 is provided in the circumferential portion of the face 11a of the circuit substrate 11 used in Embodiments 1 to 5, which circumferential portion includes the region in which the second connecting pads 7 are provided. Further, each of the connecting pads 33 serving as the second connecting pads is provided on a part of a surface of the insulating layer 31. Via each of through holes 32 formed inside the insulating layer 31, the connecting pad 33 and each of the second connecting pads 7 are connected with each other. Note that the insulating layer 31 has a region in which no connecting pad 33 is provided, and an insulating layer 34 is provided on such a region.

Within such a recess portion of the circuit substrate 30, i.e., within the portion other than the circumferential portion, the first connecting pads 6 are provided. On the other hand, in the circumferential portion of the circuit substrate 30, the connecting pads 33 are provided. Namely, each of the first connecting pads 6 is provided in the recess portion, whereas the connecting pad 33 is provided in the portion, other than the recess portion, of the face (first face) 30a of the circuit substrate 30. The face 30a is associated with the semiconductor apparatus 2.

The connecting pad 33 is provided in a position higher than the first connecting pad 6. In other words, the connecting pad 33 is so provided that a distance between the connecting pad 33 and a flat face including the face having the electrodes 4 is shorter than a distance between the first connecting pad 6 and the flat face. In this case, the flat face including the face having the electrodes 4 corresponds to (i) the rear face of the semiconductor apparatus 2, i.e., the face reverse to the face facing the internal semiconductor apparatus package 1, and (ii) a face extending from the rear face. This is because (i) the electrodes 4 are provided on the rear face 2a of the semiconductor apparatus 2, and (ii) the rear face 2a reverse to the face associated with the circuit substrate 30 is flat.

The stack type semiconductor package according to the present embodiment can be manufactured in accordance with the same manufacturing method as the manufacturing method of Embodiment 2, except that: (i) the circuit substrate 30 is used instead of the circuit substrate 11, and (ii) the adhesive sheet 9 rather than the liquid resin 15 is used to adhere the internal semiconductor apparatus 1 to the semiconductor apparatus 2.

That is, firstly carried out is preparation of (i) the internal semiconductor apparatus package 1 and (ii) the circuit substrate 30, on which the first connecting pads 6, the second connecting pads 33, and the insulating films 34 and 122 are provided. The internal semiconductor apparatus package 1 and the circuit substrate 30 can be manufactured in accordance with various well-known methods described in the aforementioned patent document 1 and the like.

Next, the projection electrodes 5 are used to respectively connect (i) the first connecting pads 6 provided on the circuit substrate 30, to (ii) the external input/output terminals 3 of the internal semiconductor apparatus package 1. In this case, the solder balls are respectively used as the projection electrodes 5, so that the first connecting pads 6 are respectively connected to the external input/output terminals 3 via the solders. The methods (1) to (5) described in Embodiment 1 can be adopted as a method for attaining the connection. For example, the solder balls, formed on the external input/output terminals 3 of the internal semiconductor apparatus package 1, are used as the projection electrodes 5, and the flux is applied to each of the first connecting pads 6, and then the internal semiconductor apparatus package 1 is installed on the circuit substrate 30 such that each of the external input/output terminals 3 is aligned with the first connecting pad 6 provided in the recess portion of the circuit substrate 30. Thereafter, the solders are melted in a heating oven. Reflow thus caused allows realization of the connection.

Thereafter, the third resin in the liquid form is dropped to the aforementioned recess portion, thereby filling the void between the internal semiconductor apparatus package 1 and the circuit substrate 11 as shown in FIG. 33.

Next, the dispenser is used to drop an uncured liquid resin 15 to the recess portion of the circuit substrate 30 such that the uncured liquid resin 15 fills the void between the internal semiconductor apparatus package 1 and the circuit substrate 30. The amount of the uncured liquid resin 15 dropped to the recess portion of the circuit substrate 30 is not limited to the amount described in FIG. 33, but may be such an amount that merely fills the void, or may be such an amount that wholly fills the recess portion. Further, this process may be omitted, and the recess portion may be sealed with the sealing resin 10 in the later sealing step using the sealing resin 10.

Next, the semiconductor apparatus 2 is adhered to the upper face (the face reverse to the face on which the external input/output terminals 3 are provided) of the internal semiconductor apparatus package 1 by way of the adhesive material 9. The adhering here is carried out in the following manner. That is, the adhesive sheet (adhesive material) 9 is provided in advance on the rear face (the face reverse to the face on which the electrodes 4 are provided) of the semiconductor apparatus 2, and then the semiconductor apparatus 2 is mounted on the upper face of the internal semiconductor apparatus package 1, with the result that the semiconductor apparatus 2 is adhered to the upper face of the internal semiconductor apparatus package 1. However, the adhering method using the adhesive material is not limited to the above method, and the adhering may be carried out as follows. That is, the adhesive sheet 9 is adhered to the upper face (the face reverse to the face on which the external input/output terminals 3 are provided), and then the semiconductor apparatus 2 is mounted on the adhesive sheet 9, with the result that the semiconductor apparatus 2 is adhered to the upper face of the internal semiconductor apparatus package 1. Moreover, instead of the adhesive sheet 9, the liquid adhesive resin (liquid adhesive material, adhesive material) 14 or the liquid resin 15 dropped to the recess portion may be used to adhere the semiconductor apparatus 2 to the upper face of the internal semiconductor apparatus package 1, as is the case with a stack type semiconductor apparatus package shown in FIG. 2.

Next, the thin metal wires 8 are used to electrically connect, in accordance with the wire bonding method, each of the electrodes 4 of the semiconductor apparatus 2 to each of the connecting pads 33 formed (i) in a position higher than each of the first connecting pads 6, and (ii) on the periphery of the recess portion of the circuit substrate 30.

Thereafter, the heat-curing sealing resin 10 is used to seal the entire components installed in the stack type semiconductor apparatus package. The entire components include the internal semiconductor apparatus package 1, the semiconductor apparatus 2, and the thin metal wires 8. In this case, the sealing resin (first resin) 10 is provided so as to seal the portion, which is not filled with the liquid resin 15, in the recess portion formed in the circuit substrate 30 installed on the internal semiconductor apparatus package 1. The sealing may be carried out in accordance with the transfer mold method using a resin pellet, or with a method of potting a liquid resin.

Finally, the solder balls serving as the projection electrodes 13 are respectively provided on (i) the external input/output terminals 12 electrically connected to the first connecting pads 33, and (ii) the external input/output terminals 12 electrically connected to the second connecting pads 7. Note that this process is carried out so as to allow the stack type semiconductor apparatus package to be a BGA package. For this reason, in cases where the stack type semiconductor apparatus package is to be a LGA package, the process is not required.

The present invention is not limited to the embodiments above, but may be altered within the scope of the claims. An embodiment based on a proper combination of technical means disclosed in different embodiments is encompassed in the technical scope of the present invention.

For example, each of the above embodiments uses the thin metal wires 8 to electrically connect the second connecting pads 7 or 33 to the corresponding electrodes 4 of the semiconductor apparatus 2, respectively; however, lead wires can be used instead of the thin metal wires 8. Further, each of the stack type semiconductor apparatus packages of the above embodiments uses the adhesive sheet 9 or the liquid adhesive resin 14 to connect the internal semiconductor apparatus package 1 to the semiconductor apparatus 2; however, the adhesive sheet 9 or the liquid adhesive resin 14 may not be used as long as the internal semiconductor apparatus package 1 and the semiconductor apparatus 2 are fixed with each other within the stack type semiconductor apparatus package.

Note that another object of the present invention is to solve the problem of the conventional techniques, and to provide a SiP realized by installing semiconductors of a plurality of types in high density.

The method for manufacturing the semiconductor apparatus of the present invention, and the semiconductor apparatus package of the present invention make it possible that a general package which can be used individually is used for the internal semiconductor apparatus package.

Therefore, the internal semiconductor apparatus package is a good item having been passed through the test. This ensures that the memory type semiconductor apparatus within the internal semiconductor apparatus package is the KGD, if the internal semiconductor apparatus package is constituted by the memory type semiconductor apparatus, and if the semiconductor apparatus is the logic type semiconductor apparatus. With this, the memory type semiconductor apparatus is free from the defect, so that the SiP is never defective. Accordingly, the expensive and good logic type semiconductor is never wasted.

Further, pin positions in the internal semiconductor apparatus package are standardized, so that a plurality of types of semiconductor apparatus (e.g., a plurality of types of semiconductor apparatus supplied from a plurality of semiconductor apparatus manufacturers) can be used without preparing another circuit substrate. With this, the circuit substrate does not need to be prepared according to the type of semiconductor apparatus.

The preparation of another circuit substrate is also not required in the following case: the memory type semiconductor apparatus in the internal semiconductor apparatus package is changed to a memory type semiconductor apparatus having a larger capacity, but the pin positions of the internal semiconductor apparatus package are unchanged.

As described above, a stack type semiconductor apparatus package of the present invention includes: (a) at least one semiconductor apparatus package (1), which has a plurality of first input/output terminals (3); (b) a first circuit substrate (11), on which the semiconductor apparatus package (1) is mounted, the first circuit substrate (11) having a first face (11a) and a second face (11b); (c) at least one first semiconductor apparatus (2), which is stacked on the semiconductor apparatus package (1) and which has a plurality of first electrodes (4); (d) a plurality of first connecting pads (6), which are so provided on the first face (11a) of the first circuit substrate (11) as to respectively correspond to the first external input/output terminals (3) of the semiconductor apparatus package (1), and which are electrically connected to the first external input/output terminals (3) of the semiconductor apparatus package (1) respectively; (d) a plurality of second connecting pads (7, 33), which are so provided on the first face (11a) of the first circuit substrate (11) as to be provided on an outer side of the first connecting pads (6), and which are electrically connected to the first electrodes (4) of the first semiconductor apparatus (2) respectively; (e) a plurality of second external input/output terminals (12), which are provided on the second face (11b) of the first circuit substrate (11), and which are made up of (i) external input/output terminals electrically connected to the first connecting pads (6) in a predetermined manner, and (ii) external input/output terminals electrically connected to the second connecting pads (7, 33) in a predetermined manner; and (f) a first resin (10) for covering the first semiconductor apparatus (2) and the semiconductor apparatus package (1), the semiconductor apparatus package (1) including: (a) a second semiconductor apparatus (101), which has a plurality of second electrodes (103); (b) a second circuit substrate (111), on which the second semiconductor apparatus (101) is mounted, the second circuit substrate (111) having a third face (111a) and a fourth face (111b); (c) a plurality of third connecting pads (106), which are provided on the third face (11a) of the second circuit substrate (111), and which are electrically connected to the second electrodes (103) of the second semiconductor apparatus (101) respectively; and (d) a second resin (110) for covering the second semiconductor apparatus (101), the first external input/output terminals (13) being provided on the fourth face (111b) of the second circuit substrate (111), and being electrically connected to the third connecting pads (106), respectively.

Note that the present invention is effective not only (i) in the case where the first semiconductor apparatus is a logic element (logic type semiconductor apparatus) and the second semiconductor apparatus is a memory element; but also (ii) in the case where the first semiconductor apparatus is a high density large capacity memory having a bad yielding ratio, and where the second semiconductor apparatus is a memory element. For example, the stack type semiconductor apparatus package may be a complex memory package in which the internal package includes a SRAM (static random access memory) and a SCRAM (static column random access memory), and in which the first semiconductor apparatus is a large capacity flash memory.

Further, the present invention is also effective not only (i) in the case where the first semiconductor apparatus is a logic element and the second semiconductor apparatus is a memory element; but also (ii) in the case where the first semiconductor apparatus is a logic element and the second semiconductor apparatus is not a semiconductor apparatus (e.g., a logic element) other than a memory element.

The stack type semiconductor apparatus package of the present invention may further include: (i) a plurality of adhesion metal members for respectively connecting the first connecting pads to the corresponding first external input/output terminals; (ii) a thin metal wire for respectively connecting the second connecting pads to corresponding first electrodes; (iii) the first resin for entirely covering the semiconductor apparatus and the semiconductor apparatus package; and (iv) a third resin, which is provided in a void between the semiconductor apparatus package and the first circuit substrate, and which is different from the first resin.

Further, it is preferable to use semiconductor apparatus packages having identical terminal positions (the respective positions of the first external input/output terminals) in cases where a plurality of types of stack type semiconductor apparatus package of the present invention are manufactured with the use of a plurality of types of semiconductor apparatus package including the second semiconductor apparatuses having different structures (positions of the second electrodes, etc.). Examples of such a plurality of types of semiconductor apparatus package include semiconductor apparatus packages manufactured by a plurality of semiconductor apparatus manufacturers. Such sameness in the positions of the terminals makes it possible that a circuit substrate accommodating to a stack type semiconductor apparatus package is used for manufacture of a different type of stack type semiconductor apparatus package, so that another first circuit substrate does not need to be prepared. As such, a plurality of types of stack type semiconductor apparatus package can be manufactured with the use of (i) one type of first circuit substrate and (ii) a plurality of types of semiconductor apparatus package. Accordingly, relatively little work and small cost is required for the manufacture of a plurality of types of semiconductor apparatus package with the use of a plurality of types of semiconductor apparatus package.

The stack type semiconductor apparatus package of the present invention further includes: a thin metal wire for connecting each of the second connecting pads to a corresponding first electrode of the first semiconductor apparatus.

The stack type semiconductor apparatus of the present invention may be arranged such that the semiconductor apparatus package and the first semiconductor apparatus are adhered to each other via an adhesive material.

As the adhesive material, a liquid resin or a sheet resin may be used. In cases where the liquid resin is used as the adhesive material, the liquid resin may be applied to the upper face of the semiconductor apparatus package; or the liquid resin may be applied in advance to the rear face of the first semiconductor apparatus. On the other hand, in the case where the sheet resin is used as the adhesive material, the sheet resin may be adhered to the upper face of the semiconductor apparatus package; or the sheet resin may be adhered in advance to the rear face of the first semiconductor apparatus. For the sake of efficiency, it is preferable that the application of the liquid resin or the adhering of the sheet resin be carried out at a time with respect to respective rear faces of a plurality of first semiconductor apparatuses that are in a form of a wafer. Thereafter, the wafer is divided into individual first semiconductor apparatuses.

It is preferable that the stack type semiconductor apparatus package of the present invention further include: a first thin metal wire connecting member, provided on a resin seal face (on the second resin) of the semiconductor apparatus package, wherein: the first thin metal wire connecting member includes a first wire, connected to (i) each of the first electrodes of the first semiconductor apparatus, and (ii) each of the second connecting pads via the thin metal wire.

It is preferable that the stack type semiconductor apparatus package further include: a second thin metal wire connecting member, provided on the first face of the first circuit substrate, wherein: the second thin metal wire connecting member includes a second wire, connected to (i) each of the first electrodes of the first semiconductor apparatus, and (ii) each of the second connecting pads via the thin metal wire. Further, the first thin metal wire connecting member and the second thin metal wire connecting member may be used together.

In each of the above structures, in cases where only the thin metal wire is used to connect the first electrode and the second connecting pad, the thin metal wire becomes so long that the thin metal wire is possibly swept away by the first resin upon providing the first resin. However, the use of such thin metal wire connecting members makes it possible to shorten the length of such a long thin metal wire. This makes it possible to prevent the wire from being swept away by the first resin upon providing the first resin. Accordingly, the short circuit due to the sweep-away can be prevented. With this, a stack type semiconductor apparatus package that can be manufactured with ease can be provided.

It is preferable that the stack type semiconductor apparatus package be arranged such that: the first electrodes are provided on a rear face of a face, on which the first circuit substrate is provided, of the first semiconductor apparatus; and each of the second connecting pads is provided so as to be higher than the face on which the first electrodes are provided. Note that, here, the wording "high (higher)" is not in terms of a height measured from ground (earth) or the like, but is in terms of a height measured from the rear face (face reverse to the face that faces the semiconductor apparatus package) of the first circuit substrate.

The structure makes it possible to shorten the length of the thin metal wire connecting the first electrode and the second connecting pad with each other. This makes it possible to prevent the wire from being swept away by the first resin upon providing the first resin. Accordingly, the short circuit due to the sweep-away can be prevented. With this, a stack type semiconductor apparatus package that can be manufactured with ease can be provided.

It is preferable that the stack type semiconductor apparatus package of the present invention be arranged such that a third resin is provided in a void between the semiconductor apparatus package and the first circuit substrate.

According to the structure, the third resin is provided between the semiconductor apparatus package and the first circuit substrate. This allows reduction of heat stress caused by a difference in thermal expansion coefficient between the semiconductor apparatus package and the first circuit substrate when the difference is large.

Moreover, in cases where the solder balls are respectively provided on the external input/output terminals of the semiconductor apparatus package, the structure makes it possible to prevent the solder balls from being melted and being deformed by heat of wire bonding carried out after adhering the semiconductor apparatus to the resin seal face of the package. This is especially effective in cases where the first semiconductor apparatus has such a fine pitch that the first circuit substrate needs to be wholly heated for the purpose of securing connection strength (adhesive strength) of a bonded wire.

It is preferable that the stack type semiconductor apparatus package be arranged such that, in a face, on which the first circuit substrate is provided, of the semiconductor apparatus package, a face of each of the first external input/output terminals projects from a face of a portion in which no first external input/output terminal is provided.

According to the structure, no solder ball needs to be formed on the external input/output terminals. This makes it possible to lower a height of the entire package. Moreover, the heating with respect to the circuit substrate can be carried out at a temperature not lower than the melting point of the solder.

In cases where the heating with respect to the circuit substrate does not need to be carried out at the temperature not lower than the melting point of the solder, there may be provided, on the first external input/output terminals, the projection electrodes that are solder balls and that are connected to the first connecting pads, respectively.

It is preferable that the stack type semiconductor apparatus package of the present invention be arranged such that, in the first face (surface facing the semiconductor apparatus package) of the first circuit substrate, a face of each of the first connecting pads projects from a portion in which no first connecting pad is provided.

According to the structure, no solder ball is provided on the external input/output terminals, as is the case with the foregoing structure. This makes it possible to lower a height of the entire package.

As described above, a method for manufacturing a semiconductor apparatus package of the present invention, the stack type semiconductor apparatus package of the present invention including: (a) at least one semiconductor apparatus package (1), which has a plurality of first input/output terminals (3); (b) a first circuit substrate (11), on which the semiconductor apparatus package (1) is mounted, the first circuit substrate (11) having a first face (11*a*) and a second face (1*b*); (c) at least one first semiconductor apparatus (2), which is stacked on the semiconductor apparatus package (1) and which has a plurality of first electrodes (4); (d) a plurality of first connecting pads (6), which are so provided on the first face (11*a*) of the first circuit substrate (11) as to respectively correspond to the first external input/output terminals (3) of the semiconductor apparatus package (1); (e) a plurality of second connecting pads (7, 33), which are so provided on the first face (11*a*) of the first circuit substrate (11) as to be provided on an outer side of the first connecting pads (6); and (f) a plurality of second external input/output terminals (12), which are provided on the second face (11*b*) of the first circuit substrate (11), and which are made up of (i) external input/output terminals electrically connected to the first connecting pads (6) in a predetermined manner, and (ii) external input/output terminals electrically connected to the second connecting pads (7, 33) in a predetermined manner; the semiconductor apparatus package (1) including: (a) a second semiconductor apparatus (101), which has a plurality of second electrodes (103); (b) a second circuit substrate (111), on which the second semiconductor apparatus (101) is mounted, the second circuit substrate (111) having a third face (111*a*) and a fourth face (111*b*); (c) a plurality of third connecting pads (106), which are provided on the third face (111*a*) of the second circuit substrate (111), and which are electrically connected to the second electrodes (103) of the second semiconductor apparatus (101) respectively; and (d) a second resin (110) for covering the second semiconductor apparatus (101), the first external input/output terminals (13) being provided on the fourth face (111*b*) of the second circuit substrate (111), and being electrically connected to the third connecting pads (106), respectively, the method including the steps of: (A) connecting the first external input/output terminals (3) of the semiconductor apparatus package to the first connecting pads (6) provided on the first circuit substrate (11), by using at least one of heat, load, and a supersonic wave; (B) electrically connecting the first electrodes (4) of the first semiconductor apparatus (2) to the second connecting pads (7, 33) of the first circuit substrate (11) via a thin metal wire (8) in accordance with a wire bonding method; and (C) covering the first semiconductor apparatus (2) and the semiconductor apparatus package (1) with a first resin (10).

It is preferable that the method further include the step of: (D) adhering the semiconductor apparatus to a resin seal upper face of the semiconductor apparatus package via an adhesive material. Note that the wording "resin seal upper face" refers to the rear face of the face on which the first external input/external terminals are provided, and the rear face is a portion where the second resin is provided.

It is preferable that the method wherein the adhesive material is an adhesive sheet, the method further include the step of: (E) prior to the step (D), providing an adhesive sheet on the resin seal upper face of the semiconductor apparatus package. According to the method, the application of the liquid adhesive material is not required, so that the adhering can be carried out with ease.

The method, wherein the adhesive material is a liquid adhesive material, the method may further include the step of: (F) prior to the step (D), applying the liquid adhesive material to the resin seal upper face of the semiconductor apparatus package.

The method does not necessarily requires a step of injecting an under fill (a connection reinforcing material for improving a connection reliability by filling and curing the connection reinforcing material between the semiconductor apparatus and the semiconductor apparatus package). Therefore, the step of injecting the under fill can be omitted, with the result that the steps can be simplified.

In cases where the void can be secured between the package and the circuit substrate after installing the semiconductor apparatus package on the first circuit substrate, the method can be realized by injecting the first resin (mold resin, or liquid package-sealing resin) into the void.

On the other hand, in cases where no void can be secured between the package and the circuit substrate after installing the semiconductor apparatus package on the first circuit substrate, the method can be realized by, e.g., using the following methods (i), (ii), and the like: (i) a method of using, in order to provide the third resin in advance on the first circuit substrate, either a semiconductor apparatus package having projecting first connecting pads, or a first circuit substrate having projecting first connecting pads; and (ii) a method of combining the resin pre-coating and the supersonic wave connecting method.

The method may further include: a step of providing, after the step (A), a third resin, different from the adhesive material, in a void between the semiconductor apparatus package and the first circuit substrate; and a step of curing the third resin.

According to the method, the third resin is a resin material different from the adhesive material for adhering the semiconductor apparatus, which third resin is provided in the void between the semiconductor apparatus package and the first circuit substrate, and which third resin serves as the under fill (connection reinforcing material for improving a connection reliability by filling and curing the connection reinforcing material between the semiconductor apparatus and the semiconductor apparatus package). This allows reduction of stress exerted from the semiconductor apparatus package to the semiconductor apparatus formed on the semiconductor apparatus package as compared with the case where the adhesive material is also used as the under fill of the semiconductor apparatus package, in cases where the adhesive material has a lower elastic modulus than the third resin (under fill) does. That is, because the semiconductor apparatus package is provided under the semiconductor apparatus in the stack type semiconductor apparatus package according to the present invention, a larger stress is exerted to the semiconductor apparatus as compared with the case where a semiconductor apparatus package is provided under the semiconductor apparatus; however, the above method allows reduction of the stress.

The method provides a noticeable effect in reliability improvement, and such a noticeable effect is rendered by causing a stack type semiconductor apparatus package to include the structure of the present invention.

The method may further include the steps of: after the step (A), (H) providing a third resin in (i) a void between the semiconductor apparatus package and the first circuit substrate, and (ii) a resin seal upper face of the semiconductor apparatus package; (I) mounting the first semiconductor apparatus on the resin seal upper face of the semiconductor apparatus package via the third resin; and (J) curing, at a time, (i) the third resin provided between the first semiconductor apparatus and the resin seal upper face of the semiconductor apparatus package, and (ii) the third resin provided in the void.

According to the method, the third resin is used as both (i) the adhesive material for use in mounting the semiconductor apparatus on the resin seal upper face of the semiconductor apparatus package, and (ii) the under fill of the internal semiconductor apparatus package, particularly in cases where the projection electrodes that are the solder balls are respectively provided on the first external input/output terminals. The third resin is injected (applied) in one step (dispense step), so that the number of the steps is reduced. With this, the manufacturing process becomes effective. The method provides a noticeable effect in the manufacturing efficiency, and such a noticeable effect is rendered by causing a stack type semiconductor apparatus package to include the structure of the present invention.

The method may further include the step of: prior to the step (A), (K) providing a third resin in a region of the first circuit substrate, on which region the semiconductor apparatus package is mounted.

The stack type semiconductor apparatus package according to the present invention is thicker (higher) than a stack type semiconductor apparatus package obtained by stacking a plurality of unpackaged semiconductor apparatuses. The method does not require solder-connecting as described later in the event of using (i) a semiconductor apparatus package having projecting first external input/output terminals (a semiconductor apparatus package having first external input/output terminals which are provided on the face that faces the first circuit substrate, and which project higher than the portion in which no first external input/output terminals are provided); or (ii) a first circuit substrate having projecting first connecting pads (a semiconductor apparatus package having first connecting pads projecting higher than the portion, in which no first external input/output terminals are provided, on the first surface). Accordingly, the thickness (height) of the stack type semiconductor apparatus package becomes thinner (lower).

The method may be arranged such that an anisotropic conductive adhesive agent is used as the third resin.

The stack type semiconductor apparatus package according to the present invention is thicker (higher) than a stack type semiconductor apparatus package obtained by stacking a plurality of unpackaged semiconductor apparatuses. However, the method does not require solder-connecting in the event of using (i) a semiconductor apparatus package having projecting first external input/output terminals; or (ii) a first circuit substrate having projecting first connecting pads. Accordingly, the thickness (height) of the stack type semiconductor apparatus package becomes thinner (lower).

The method may be arranged such that: in the step (A), projection electrodes that are solder balls are respectively provided on the first external input/output terminals, and the connecting of the first external input/output terminals with the respective first electrode pads is carried out, by pressing the semiconductor apparatus package against the first circuit substrate via a third resin, instead of melting the projection electrodes.

The connection becomes bad in cases where the stack type semiconductor apparatus package according to the present invention includes a general semiconductor apparatus package having solder balls and a fine terminal pitch, and where the first circuit substrate is winded upon the reflow connecting. Especially in cases where the first circuit substrate is thin, such a bad connection is likely to be obtained.

The method above does not use the reflow to attain the connection, so that the solder balls are never melted. Specifically, pressure is applied so as to connect the semiconductor apparatus package to the first circuit substrate with the third resin therebetween. This makes it possible to solve the problem of the aforementioned bad connection. A specific example of the third resin is: the anisotropic conductive film (ACF), the anisotropic conductive paste (ACP), the non-conductive film (NCF), or the non-conductive paste (NCP). The method solves the problem occurring in cases where the structure of the present invention includes the general semiconductor apparatus package having the solder balls, and the method provides a noticeable effect.

The method may be arranged such that: in the step (A), projection electrodes that are solder balls are respectively provided on the first external input/output terminals, and the connecting of the first electrode pads with the respective first external input/output terminals is carried out by melting the projection electrodes.

The method may further include the step of: (L) adhering, to a resin seal face of the semiconductor apparatus package, a first thin metal wire connecting member including a first wire, wherein: in the step (B), the first wire is electrically connected, via the thin metal wire, to (i) the first electrodes of the first semiconductor apparatus, and (ii) the first connecting pads provided on the first circuit substrate.

The method may further include: (M) adhering, to the first face of the first circuit substrate, a second thin metal wire connecting member including a second wire, wherein: in the step (B), the second wire is electrically connected, via the thin metal wire, to (i) the first electrodes of the first semiconductor apparatus, and (ii) the first connecting pads provided on the first circuit substrate.

The method may be arranged such that: the first face of the first circuit substrate has a recess portion; the first connecting pads are provided in the recess portion; and the second connecting pads are provided on a portion other than the recess portion of the first face of the first circuit substrate, and which portion is higher than the face on which the first connecting pads are provided.

The present invention is able to be used for (i) a stack type semiconductor apparatus package in which a plurality of semiconductor apparatuses are provided in high density, and (ii) manufacturing thereof. Examples of the stack type semiconductor apparatus package include: the CSP (chip size package), the BGA (ball grid array), and the like.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A stack type semiconductor apparatus package, comprising:
at least one semiconductor apparatus package, which has a plurality of first input/output terminals;
a first circuit substrate, on which the semiconductor apparatus package is mounted, the first circuit substrate having a first face and a second face;

at least one first semiconductor apparatus, which is stacked on the semiconductor apparatus package and which has a plurality of first electrodes;

a plurality of first connecting pads, which are so provided on the first face of the first circuit substrate as to respectively correspond to the first external input/output terminals of the semiconductor apparatus package, and which are electrically connected to the first external input/output terminals of the semiconductor apparatus package respectively;

a plurality of second connecting pads, which are so provided on the first face of the first circuit substrate as to be provided on an outer side of the first connecting pads, and which are electrically connected to the first electrodes of the first semiconductor apparatus respectively;

a plurality of second external input/output terminals, which are provided on the second face of the first circuit substrate, and which are made up of (i) external input/output terminals electrically connected to the first connecting pads in a predetermined manner, and (ii) external input/output terminals electrically connected to the second connecting pads in a predetermined manner; and a first resin for covering the first semiconductor apparatus and the semiconductor apparatus package, the semiconductor apparatus package including:

a second semiconductor apparatus, which has a plurality of second electrodes;

a second circuit substrate, on which the second semiconductor apparatus is mounted, the second circuit substrate having a third face and a fourth face;

a plurality of third connecting pads, which are provided on the third face of the second circuit substrate, and which are electrically connected to the second electrodes of the second semiconductor apparatus respectively; and a second resin for covering the second semiconductor apparatus, the first external input/output terminals being provided on the fourth face of the second circuit substrate, and being electrically connected to the third connecting pads, respectively.

2. The stack type semiconductor apparatus package as set forth in claim 1, further comprising:

a thin metal wire for connecting each of the second connecting pads to a corresponding first electrode of the first semiconductor apparatus.

3. The stack type semiconductor apparatus package as set forth in claim 1, wherein:

the semiconductor apparatus package and the first semiconductor apparatus are adhered to each other via an adhesive material.

4. The stack type semiconductor apparatus package as set forth in claim 2, further comprising:

a first thin metal wire connecting member, provided on a resin seal face of the semiconductor apparatus package, wherein:

the first thin metal wire connecting member includes a first wire, connected to (i) each of the first electrodes of the first semiconductor apparatus, and (ii) each of the second connecting pads via the thin metal wire.

5. The stack type semiconductor apparatus package as set forth in claim 2, further comprising:

a second thin metal wire connecting member, provided on the first face of the first circuit substrate, wherein:

the second thin metal wire connecting member includes a second wire, connected to (i) each of the first electrodes of the first semiconductor apparatus, and (ii) each of the second connecting pads via the thin metal wire.

6. The stack type semiconductor apparatus package as set forth in claim 2, wherein:

the first electrodes are provided on a rear face of a face, on which the first circuit substrate is provided, of the first semiconductor apparatus; and each of the second connecting pads is provided so as to be higher than the face on which the first electrodes are provided.

7. The stack type semiconductor apparatus package as set forth in claim 1, wherein:

a third resin is provided in a void between the semiconductor apparatus package and the first circuit substrate.

8. The stack type semiconductor apparatus package as set forth in claim 1, wherein:

in a face, on which the first circuit substrate is provided, of the semiconductor apparatus package, a face of each of the first external input/output terminals projects from a face of a portion in which no first external input/output terminal is provided.

9. The stack type semiconductor apparatus package as set forth in claim 1, wherein:

projection electrodes, which are solder balls and which are respectively connected to the first connecting pads, are provided on the first external input/output terminals.

10. The stack type semiconductor apparatus package as set forth in claim 1, wherein:

in the first face of the first circuit substrate, a face of each of the first connecting pads projects from a portion in which no first connecting pad is provided.

11. The stack type semiconductor apparatus package as set forth in claim 1, wherein:

the second semiconductor apparatus is a memory element.

12. The stack type semiconductor apparatus package as set forth in claim 1, wherein:

the first semiconductor apparatus is a logic element.

13. The stack type semiconductor apparatus package as set forth in claim 1, wherein:

the first face of the first circuit substrate has a recess portion;

the first connecting pads are provided in the recess portion; and the second connecting pads are provided in a portion other than the recess portion of the first face of the first circuit substrate, which portion is higher than the face on which the first connecting pads are provided.

14. A method for manufacturing a stack type semiconductor apparatus package, said package including:

at least one semiconductor apparatus package, which has a plurality of first input/output terminals;

a first circuit substrate, on which the semiconductor apparatus package is mounted, the first circuit substrate having a first face and a second face;

at least one first semiconductor apparatus, which is stacked on the semiconductor apparatus package and which has a plurality of first electrodes;

a plurality of first connecting pads, which are so provided on the first face of the first circuit substrate as to respectively correspond to the first external input/output terminals of the semiconductor apparatus package;

a plurality of second connecting pads, which are so provided on the first face of the first circuit substrate as to be provided on an outer side of the first connecting pads; and a plurality of second external input/output terminals, which are provided on the second face of the first circuit substrate, and which are made up of (i) external input/output terminals electrically connected to the first connecting pads in a predetermined manner, and (ii) external input/output terminals electrically connected to the second connecting pads in a predetermined manner;

said semiconductor apparatus package including:

a second semiconductor apparatus, which has a plurality of second electrodes;

a second circuit substrate, on which the second semiconductor apparatus is mounted, the second circuit substrate having a third face and a fourth face;

a plurality of third connecting pads, which are provided on the third face of the second circuit substrate, and which are electrically connected to the second electrodes of the second semiconductor apparatus respectively; and a second resin for covering the second semiconductor apparatus, the first external input/output terminals being provided on the fourth face of the second circuit substrate, and being electrically connected to the third connecting pads respectively, said method, comprising the steps of:

(A) connecting the first external input/output terminals of the semiconductor apparatus package to the first connecting pads provided on the first circuit substrate, by using at least one of heat, load, and a supersonic wave;

(B) electrically connecting the first electrodes of the first semiconductor apparatus to the second connecting pads of the first circuit substrate via a thin metal wire in accordance with a wire bonding method; and (C) covering the first semiconductor apparatus and the semiconductor apparatus package with a first resin.

15. The method as set forth in claim 14, further comprising the step of:

(D) adhering the first semiconductor apparatus to a resin seal upper face of the semiconductor apparatus package via an adhesive material.

16. The method as set forth in claim 15, wherein the adhesive material is an adhesive sheet, said method, further comprising the step of:

(E) prior to the step (D), providing an adhesive sheet on the resin seal upper face of the semiconductor apparatus package.

17. The method as set forth in claim 15, wherein the adhesive material is a liquid adhesive material, said method, further comprising the step of:

(F) prior to the step (D), applying the liquid adhesive material to the resin seal upper face of the semiconductor apparatus package.

18. The method as set forth in claim 15, further comprising the step of:

(G) after the step (A), providing a third resin, which is different from the adhesive material, into a void between the semiconductor apparatus package and the first circuit substrate.

19. The method as set forth in claim 14, further comprising the steps of:

after the step (A), (H) providing a third resin in (i) a void between the semiconductor apparatus package and the first circuit substrate, and (ii) a resin seal upper face of the semiconductor apparatus package;

(I) mounting the first semiconductor apparatus on the resin seal upper face of the semiconductor apparatus package via the third resin; and (J) curing, at a time, (i) the third resin provided between the first semiconductor apparatus and the resin seal upper face of the semiconductor apparatus package, and (ii) the third resin provided in the void.

20. The method as set forth in claim 14, further comprising the step of:

prior to the step (A), (K) providing a third resin in a region of the first circuit substrate, on which region the semiconductor apparatus package is mounted.

21. The method as set forth in claim 14, wherein:

in the step (A), projection electrodes that are solder balls are respectively provided on the first external input/output terminals, and the connecting of the first electrode pads with the respective first external input/output terminals is carried out by melting the projection electrodes.

22. The method as set forth in claim 14, wherein:

in the step (A), projection electrodes that are solder balls are respectively provided on the first external input/output terminals, and the connecting of the first external input/output terminals with the respective first electrode pads is carried out, by pressing the semiconductor apparatus package against the first circuit substrate via a third resin, instead of melting the projection electrodes.

23. The method as set forth in claim 20, wherein:

an anisotropic conductive adhesive agent is used as the third resin.

24. The method as set forth in claim 14, further comprising the step of:

(L) adhering, to a resin seal face of the semiconductor apparatus package, a first thin metal wire connecting member including a first wire, wherein:

in the step (B), the first wire is electrically connected, via the thin metal wire, to (i) the first electrodes of the first semiconductor apparatus, and (ii) the first connecting pads provided on the first circuit substrate.

25. The method as set forth in claim 14, further comprising:

(M) adhering, to the first face of the first circuit substrate, a second thin metal wire connecting member including a second wire, wherein:

in the step (B), the second wire is electrically connected, via the thin metal wire, to (i) the first electrodes of the first semiconductor apparatus, and (ii) the first connecting pads provided on the first circuit substrate.

26. The method as set forth in claim 14, wherein:

the first face of the first circuit substrate has a recess portion;

the first connecting pads are provided in the recess portion; and the second connecting pads are provided on a portion other than the recess portion of the first face of the first circuit substrate, and which face is higher than the face on which the first connecting pads are provided.

* * * * *